(12) United States Patent
Sinopoli et al.

(10) Patent No.: US 12,538,461 B2
(45) Date of Patent: Jan. 27, 2026

(54) COOLED MODULAR POWER-CONVERTING ELECTRICAL PANEL

(71) Applicant: FUTURi POWER INC., Vancouver (CA)

(72) Inventors: Lucas Pablo Sinopoli, Vancouver (CA); Carlos Javier Paredes, Villa Dolores (AR); Mohammad Amin Zakershobeiri, Vancouver (CA); Jhih-Da Hsu, Vancouver (CA); Tomas Syskakis, Vancouver (CA)

(73) Assignee: FUTURi Power Inc., Vancouver (CA)

( * ) Notice: Subject to any disclaimer, the term of this patent is extended or adjusted under 35 U.S.C. 154(b) by 259 days.

(21) Appl. No.: 18/306,980

(22) Filed: Apr. 25, 2023

(65) Prior Publication Data

US 2023/0345681 A1 Oct. 26, 2023

Related U.S. Application Data

(60) Provisional application No. 63/334,418, filed on Apr. 25, 2022, provisional application No. 63/334,408, filed on Apr. 25, 2022.

(51) Int. Cl.
H05K 7/20 (2006.01)

(52) U.S. Cl.
CPC ..... *H05K 7/20927* (2013.01); *H05K 7/20909* (2013.01); *H05K 7/20945* (2013.01)

(58) Field of Classification Search
None
See application file for complete search history.

(56) References Cited

U.S. PATENT DOCUMENTS

| | | | | |
|---|---|---|---|---|
| 9,516,794 | B2* | 12/2016 | Mulcahy | H05K 7/20927 |
| 2009/0181717 | A1* | 7/2009 | Lo | G06K 7/0008 |
| | | | | 455/550.1 |
| 2010/0118488 | A1* | 5/2010 | Hoffman | H05K 7/20909 |
| | | | | 363/141 |
| 2021/0083506 | A1* | 3/2021 | Rao | H02H 7/261 |

* cited by examiner

*Primary Examiner* — Mukundbhai G Patel
(74) *Attorney, Agent, or Firm* — Damien G. Loveland; Valuetech Patent Agency Inc.

(57) ABSTRACT

Changing electrical power needs for buildings often requires the upgrade of the electrical panel, the addition of extra panels, or both. Herein, a single electrical panel hosts power interface modules that connect to multiple power rails within the panel. The modules, which plug into the panel, convert power between the rails, or make and break connections between the rails, under the command of a system controller. The rails are connected to switchgear to which a variety of external power sources and loads can be connected. The modules are cooled by a heat exchanger and the waste heat may be directed outside or used to heat inside the building or heat domestic water.

20 Claims, 10 Drawing Sheets

COOLED MODULAR POWER-CONVERTING ELECTRICAL PANEL

TECHNICAL FIELD

This invention relates generally to the field of power management and more specifically to a cooled, modular, power-conversion system for managing multiple power devices, sources and loads in single and multi-unit residential homes and other buildings.

BACKGROUND

Traditional electrical panel technology has remained unchanged for many years. Typically, after a panel is installed it cannot be upgraded unless an additional panel is connected to it or the original panel is replaced. As more and more power technologies are coming within the grasp of the average homeowner, there is an increasing need to connect solar panels, home storage batteries and electrical vehicle chargers to the panel. In line with this, the total current capacity of the panel often needs to be increased.

Patent application US20220149745 to Ibrahim et al. provides a bidirectional power converter capable of receiving and delivering AC and DC power from and to multiple ports. The AC or DC input receives power and at least two power conversion circuits work with a plurality of switches. The power conversion circuits may be rectifier inverters and have a modular form, which connect to the AC and DC ports via a backplane having multiple connectors.

Patent application US20120126623 to Koehl describes a modular portal system and method for harvesting energy from distributed power sources. The distributed power sources include renewable and nonrenewable energy sources, which are coupled to a backplane. The backplane receives modular preconditioner modules and inverter modules, which are inserted into module slots. The backplane also includes a controller for selectively coupling the energy harvesting system to a power grid.

U.S. Pat. No. 10,396,554 to Chik et al. describes controlling power distribution from a plurality of inverters to one or more loads. The method comprises determining, using one or more computer processors, a plurality of possible combinations of the plurality of inverters to meet load demands corresponding to the one or more loads. Each possible combination of the plurality of possible combinations includes a respective set of one or more inverters of the plurality of inverters. The method further comprises accessing one or more predefined efficiency functions associated with the inverters, selecting a combination, and transmitting control signals to the inverters corresponding to the selected combination to thereby power the one or more loads.

U.S. Pat. No. 10,277,035 to Gudgel et al. relates to a modular inverter system having a system controller module that includes several electronic switches that may be controlled to couple various nodes in the system controller module to various circuits coupled to input/output terminals at the modular inverter system to realize various modes of operation.

U.S. Pat. No. 6,738,692 to Schienbein et al. discloses a power conversion and energy management system with a controller, one or more standard modules, and a custom or semi-custom backplane. The backplane preferably accommodates one or more modules and uses the modules to control power quality and/or flow to one or more input and/or output connections. The standard modules are preferably power modules such as an inverter module, converter module, or grid connect module.

This background is not intended, nor should be construed, to constitute prior art against the present invention.

SUMMARY

An electrical panel disclosed herein has multiple power rails to which multiple power interface modules connect. Each power interface module is a DC-DC converter, a rectifier, an inverter, an interconnection module or a combination of any two or more of these. The modules in the panel may be different or of the same type. A system controller in the panel or in a controller module commands the individual modules to either connect or disconnect their internal power circuitry or interconnections to or from one or more of the power rails. Depending on the embodiment, any module may be connected in any position in the panel and the system controller will identify its type, capabilities and connectability to the rails via communication with the modules on a communications bus. The system controller then commands the modules according to the requirements of the loads and sources connected to the panel.

A cooling channel is present in the panel via which waste heat generated by the power interface modules is removed from the panel. The waste heat may be selectively expelled or used for beneficial purposes, such as heating a room or water. The panel may be configured so that the modules plug into sockets at both sides of the panel, and retain the modules in position. Heat is drawn from the modules, e.g. from the center or elsewhere.

Disclosed herein is an electrical panel that converts electrical power and is cooled, the electrical panel comprising: a casing defining an inlet for a coolant and an outlet for the coolant; a heat-exchanging zone within the casing between the inlet and the outlet; multiple power rails located in the casing outside of the heat-exchanging zone; multiple sets of sockets electrically connected to the power rails, each set located to accept plugs on a power interface module, which, when connected to the electrical panel is in direct thermal contact with the heat-exchanging zone; a communications bus that electrically connects to the power interface module when the plugs are connected to at least some of the sockets; and a system controller programmed to detect an electrical connection of the power interface module to the communications bus; wherein, when the power interface module is connected to the electrical panel, the coolant flows from the inlet, through the heat-exchanging zone and to the outlet and draws heat from the power interface module.

Also disclosed herein is an energy distribution system comprising multiple power interface modules, and an electrical panel to which the multiple power interface modules are impermanently connected, the electrical panel comprising: a casing defining an inlet for a coolant and an outlet for the coolant; a heat-exchanging zone within the casing between the inlet and the outlet; multiple power rails located in the casing outside of the heat-exchanging zone; multiple sets of sockets electrically connected to the power rails, each set located to accept plugs on one of the power interface modules, which, when connected to the electrical panel are in direct thermal contact with the heat-exchanging zone; a communications bus that electrically connects to the power interface modules when the plugs are connected to at least some of the sockets; and a system controller programmed to detect an electrical connection of the power interface modules to the communications bus; wherein, when the power interface modules are connected to the electrical panel, the coolant flows from the inlet, through the heat-exchanging zone and to the outlet and draws heat from the power interface modules.

Further disclosed herein is a method carried out by an electrical panel that converts electrical power and is cooled, the method comprising: detecting multiple power interface modules connected to the electrical panel; computing possible connection configurations between the power interface modules and multiple power rails in the electrical panel; predicting loads to be supplied by the electrical panel; determining, from the possible connection configurations, a target configuration for supplying the loads; controlling the power interface modules to achieve the target configuration; diverting heated air, from a heat-exchanging zone in direct thermal contact with the power interface modules, out of a front cover of the electrical panel when a temperature in a room in which the electrical panel is mounted is below a threshold; and diverting the heated air out of a side wall of the electrical panel when the temperature is above the threshold.

Still further disclosed is a method carried out by an electrical panel that converts electrical power and is cooled, the method comprising: detecting one or more power interface modules connected to the electrical panel; measuring loads to be supplied by the electrical panel; identifying and measuring peripheral power sources connected to the electrical panel; computing possible connection configurations between the one or more power interface modules and multiple power rails in the electrical panel; determining, from the possible connection configurations, a target configuration for converting and distributing power between the loads and the peripheral power sources; controlling the one or more power interface modules to achieve the target configuration; and diverting a coolant, from a heat-exchanging zone in direct thermal contact with the one or more power interface modules, through a selectable one or more of multiple outlets in the electrical panel.

BRIEF DESCRIPTION OF THE FIGURES

The following drawings illustrate embodiments of the invention and should not be construed as restricting the scope of the invention in any way.

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. Glossary
   AC—Alternating current
   DC—Direct current
   EV—Electric vehicle
   Module, or power interface module, or power transfer module, or power conversion module, or power module-a rectifier, inverter, DC-DC converter, interconnection module or a combination of any or multiple ones of these.
   PV—Photovoltaic, or solar panel
   Rail, or power rail—an electrical conductor or a pair or more of electrical conductors to which multiple power interface modules may be connected. For example, positive and negative DC conductors may be referred to as "a rail". The two live phases and a neutral conductor may also be considered to be "a rail". Depending on the context, "a rail" may refer to a single conductor.
   Source—this may refer to a source that provides power to the electric panel, or a source that is attached to the electric panel and provides power externally, e.g. to a micro-grid, in which case the source acts as a load with respect to the panel.
   System, or energy distribution system—a combination of a cooled, electrical panel and one or more impermanently connected power interface modules, the system being a subject of the presently disclosed invention.

2. System

Figure 1:
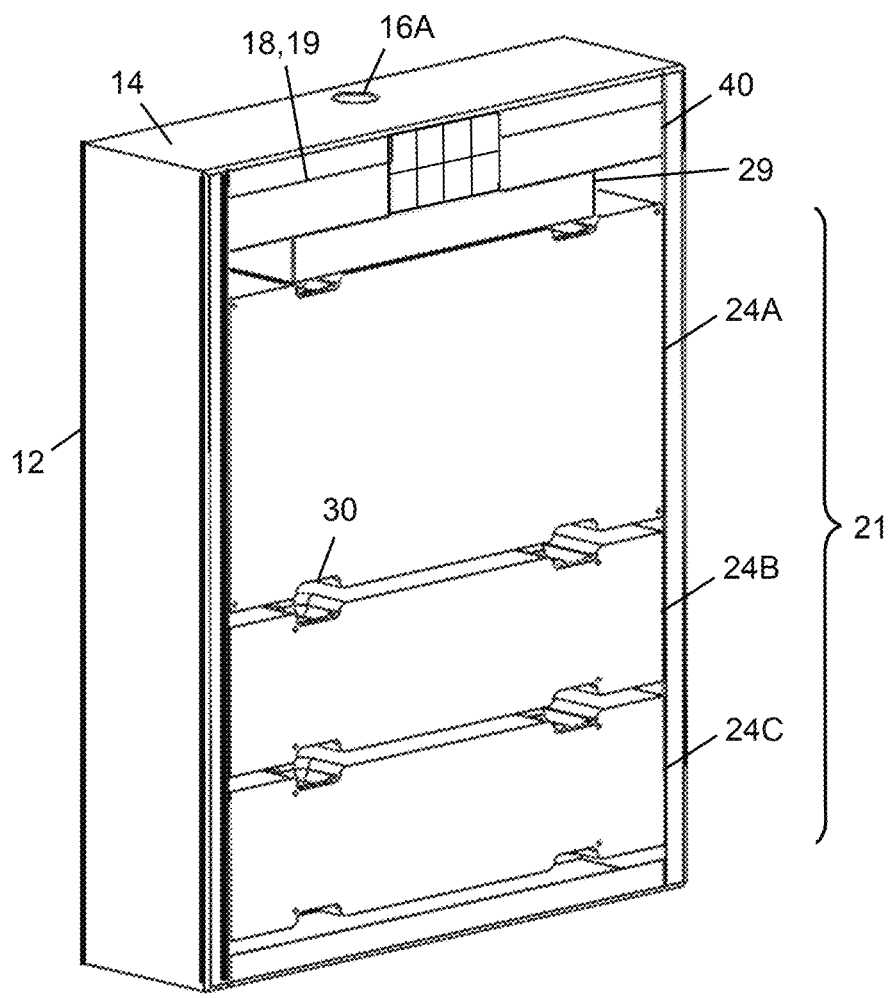
FIG. 1 is a perspective view of a representation of an electrical panel, according to an embodiment of the present invention.
Figure 2:
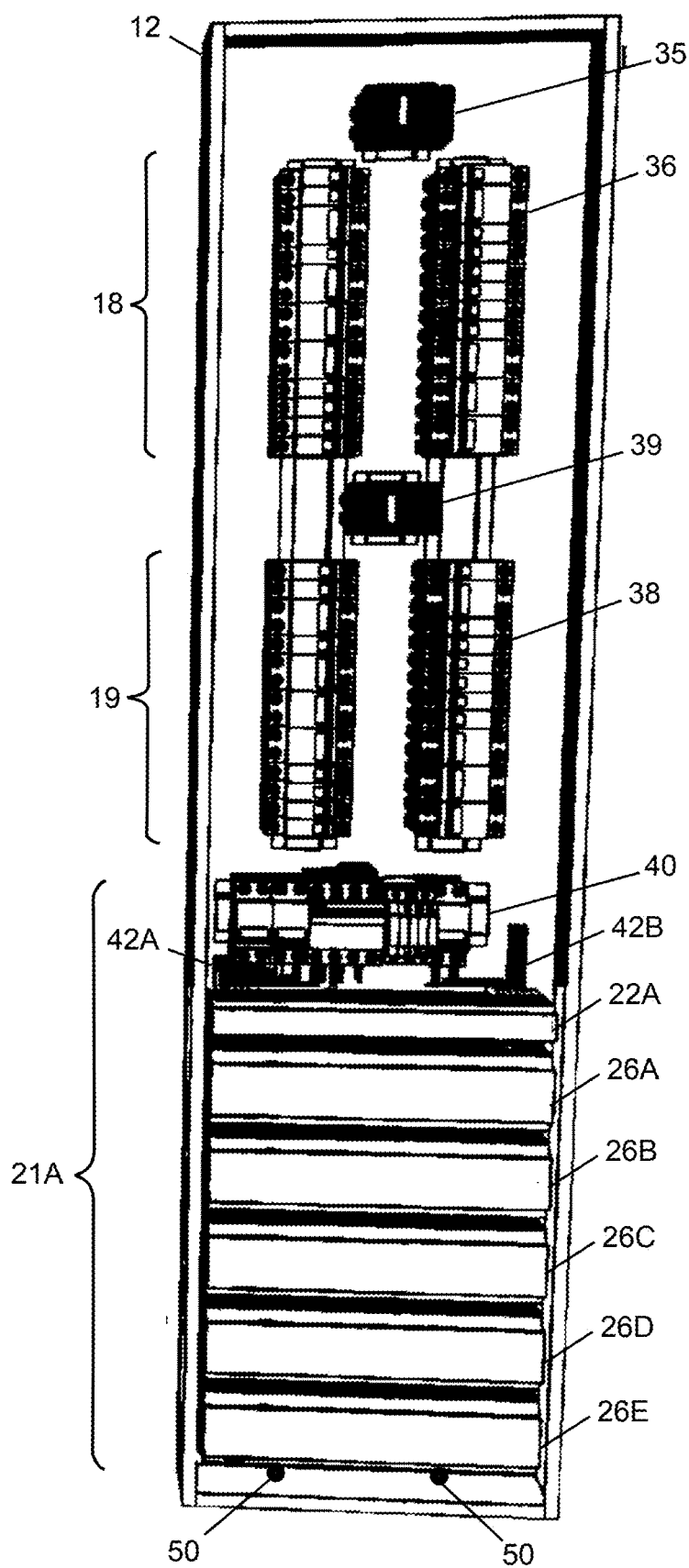
FIG. 2 is a perspective view of an electrical panel, according to another embodiment of the present invention.
Figure 3:
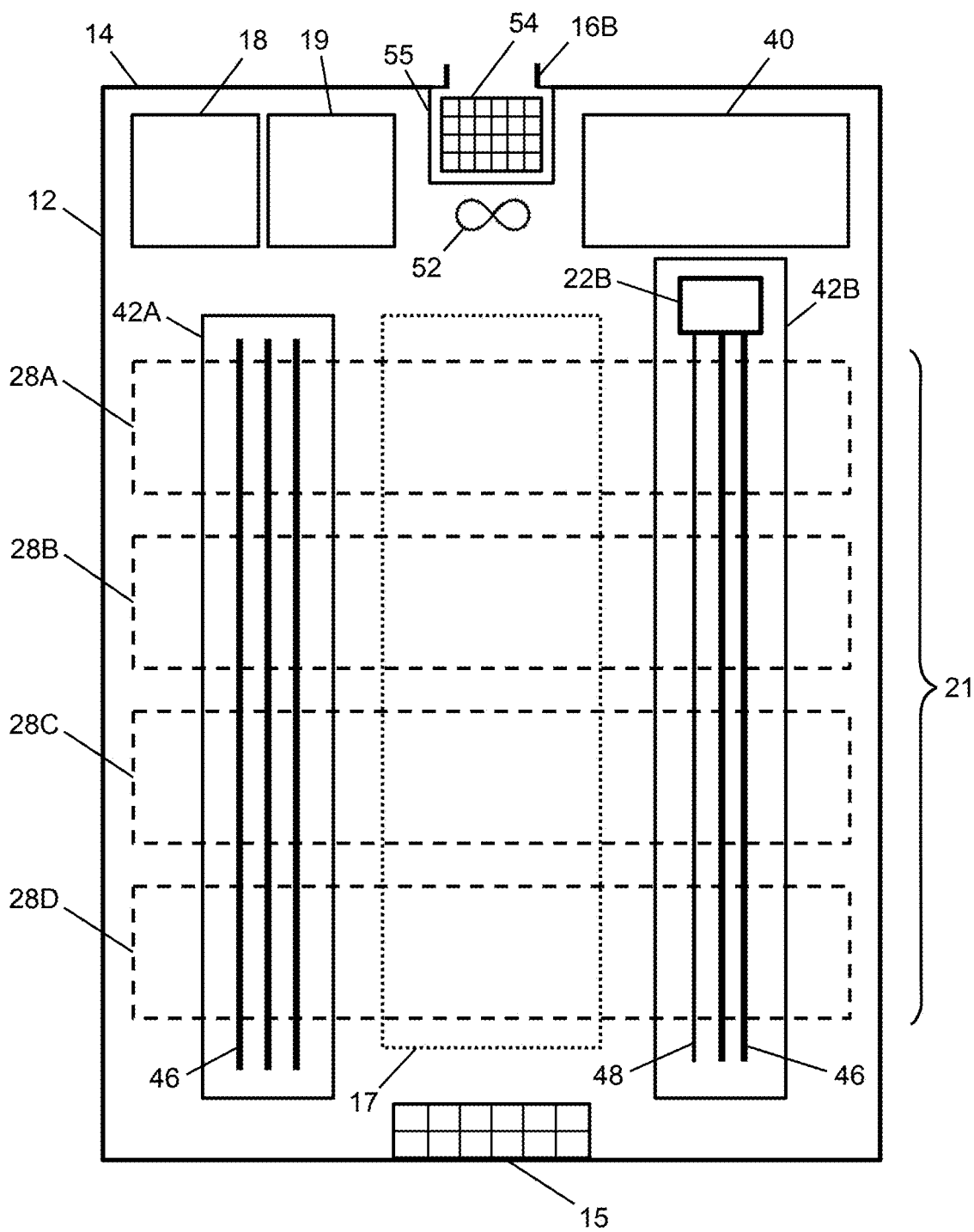
FIG. 3 is a schematic diagram of an electrical panel, according to another embodiment of the present invention.

As shown in FIGS. 1-3, various embodiments of a system are depicted for managing multiple electrical power devices, sources and loads. The system has a housing with a casing 12 and cover or door including: a set of electrical ports, a coolant inlet 15, a coolant outlet 16A, 16B in a top wall 14 of the casing, a heat exchanger in a heat-exchanging zone 17, a circuit breaker region 18, a backup circuit breaker region 19, a module interface region 21, 21A and a system controller 22A, 22B with a communication module. The circuit breaker region 18 is configured to impermanently locate a set of circuit breakers 36 between an electrical service circuit with main breaker 35 and a set of building electrical circuits. The backup circuit breaker region 19 is configured to impermanently locate a set of circuit breakers 38 via a contactor or breaker 39 to supply a set of building electrical circuits via the electrical service, or via an inverter and/or generator.

The module interface region 21A includes: switchgear 40 defining a set of circuit breakers and protections (e.g. arrester), one or more busbar power strips 42A, 42B defining an array of possible connections, and a communication bus 48. The busbar power strip may be divided into two portions, either side of the heat-exchanging zone 17. In some embodiments, the plugs that connect the modules to the busbar power strips may lend some mechanical support to the modules, which is aided by having the plugs located on both sides of the module. In some cases, dummy plugs may be used where an electrical connection is not required.

The busbar power strips are located outside of the heat-exchanging zone. The busbar power strips and the heat-exchanging zone may be in the same general plane, for example, or the power strips may be arranged perpendicularly to the heat-exchanging zone. The module interface region is configured to impermanently locate a set of power interface modules 24A-C, 26A-E, 28A-D electrically connected to the busbar power strip and coupled with the system controller through the communication bus. The busbar power strip includes: a set of power rails 46 arranged within the module interface region and coupled to the switchgear or breaker connected to the electrical service and another set of power rails arranged within the module interface region and coupled to the switchgear connected to peripheral power sources and loads. The power rails can be used as DC-power rails or AC-power rails.

The system controller 22A, 22B is connected to the busbar power strip and the communication bus 48 and is configured to monitor the status and performance and command the operation of the entire system. The communication module can be included as part of the system controller and configured to transmit data to and receive data from external systems, e.g. the peripheral power sources and loads or a user's personal communication device.

The heat exchanger is connected to the coolant inlet and the coolant outlet, thermally coupled to the module interface region, and configured to extract thermal energy from the set of power interface modules. A liquid heat exchanger 50, which passes behind the modules, is shown in the embodiment of FIG. 2, while a fan 52 draws air through the heat-exchanging zone 17 in the embodiment of FIG. 3, in which the warmed air from the heat-exchanging zone passes into the hot air zone 29, which acts as a buffer to control the pressure gradient for efficient operation of the fan. In FIG. 3, a secondary coolant outlet 54 is present in the front cover 55 (partially shown) or door of the electrical panel. An air diverter inside the panel can selectively direct the heated air out through the top wall 14 of the casing and via ducting and a vent to the outside of the building in which the panel is installed, or through the secondary outlet 54 into the room in which the panel is installed, to warm the room. In another example, a second outlet is included in the diverter to vent air in the building into the heat recovery ventilation (HRV) or the forced air furnace ducts. There are four possibilities for the hot air coming from the panel: 1) vent it to the outside of the building; 2) vent it to the intake of the HRV (heat recovery ventilation) of the building; 3) vent it to the intake of the forced air furnace; 4) vent it through the front of the equipment.

In general, power interface modules are one of the following types: a DC/DC converter module; an inverter module; a rectifier module; an interconnection module; or a combo interface module that combines one or more DC/DC converters, inverters, rectifiers, and interconnection modules inside one power interface module. Recesses 30 are defined in the enclosures of the modules so that they can be gripped while inserting or removing them.

In one variation, the DC/DC converter module is configured to: impermanently install in the module interface region; condition DC-power received from a solar array via a set of DC-power rails; and deliver conditioned DC-power to a backup battery via another set of DC-power rails.

In another variation, the rectifier module is configured to: impermanently install in the module interface region; condition AC-power received from a generator via a set of AC-power rails into DC-power; and deliver conditioned DC-power to a set of DC-power rails.

In another variation, a combo interface module is configured to: impermanently install in the module interface region; condition AC-power received from the electrical service via the AC-power rail into DC-power; deliver conditioned DC-power to a set of DC-power rails; condition DC-power received from the DC power rails; and deliver conditioned DC-power to an electric vehicle battery pack via another set of DC-power rails. In this case the combo module would be composed of two modules, a inverter connected in series to a DC/DC.

In general, the power interface modules are coupled to the heat exchanger in the housing. In one variation, the heat exchanger is connected to an open-loop liquid cooling system. In another variation, the heat exchanger is connected to a closed-loop liquid cooling system. In another variation, the heat exchanger is connected to a variable liquid cooling system. In yet another variation, the heat exchanger is connected to an air duct for natural convection cooling or forced air cooling.

Generally, the system defines an integrated modular power system and electrical panel with: multiple discrete circuit breakers to supply electrical current to individual electrical circuits within a building (e.g., residential home); multiple discrete circuit breakers to supply backup circuits; and multiple power interface modules configured to interface energy distribution between peripheral power sources, loads, and a main electrical service of the building. Peripheral power sources and loads may include one or more solar arrays, backup batteries, electric vehicle battery packs, electrolyzers, fuel cells, LED lights, and internal combustion generator systems.

2.1 Housing

In particular, the system includes a housing defining a circuit breaker region and a module interface region. For example, the housing or the casing 12 thereof can be configured to mount to a wall of the building in a surface-mount configuration or in a flush-mount configuration for new construction or a retrofit installation. In some embodiments, the housing may be mounted so that a cover or door of the housing stands proud of the wall in which the housing is embedded. The outer wall or back of the casing has ports for connecting electrical cables to the various connected components external to the electrical panel. The casing may define apertures or slots that fixing devices such as screws can pass through to fix the panel to studs within the wall. In other embodiments, the front of the casing is flanged, with holes or slots for fixing the panel to the front surfaces of the studs. In some embodiments, the dimensions of the panel are such that it fits between two adjacent studs and can be fixed to both of them.

In one implementation, the housing is configured to mount to a wall in a surface mount configuration with the housing protruding from the wall into the adjacent space. In this implementation, the set of electrical ports, connectors, conduit, and/or wiring, can be arranged in the sidewalls of the housing and electrically connected to the switchgear and/or power interface modules. In another implementation, the housing is configured to insert into the wall such that the housing is flush with the surface of the wall.

2.2 Module Interface Region

The module interface region 21 impermanently accepts a set of power interface modules configured to connect to and condition power for peripheral power sources (e.g., a solar array, a backup battery, an electric vehicle battery pack, an internal combustion generator) and electrical service, and transfer power to other power interface modules, peripheral power sources, loads, or electrical service. A power interface module includes, depending on the embodiment, a combination of any one or more of: a mechanical enclosure; an internal controller; a set of power electronic circuits; a set of signal conditioning circuits; a set of electrical connectors; a set of connection switches; a metal plate or heatsink; and a set of attachment points. Power interface modules convert and deliver power via the set of power rails or provide interconnections therebetween, the power rails being used for AC or DC. Some power interface modules may convert and deliver power via a direct external connector, e.g. to supply a low voltage DC line for LED (light-emitting diode) lighting circuits.

The module interface region includes switchgear, busbar power strip, heat exchanger, and, depending on the embodiment, a system controller. The module interface region is configured to locate and connect a set of power interface modules to the busbar power strip, and to connect the power interface modules to the system controller; and interfaces peripheral power sources, loads, and electrical service power into the building via the busbar power strip using power interface modules. A set of power rails and electrical connectors in the busbar power strip is arranged to distribute power between the power interface modules, peripheral power sources, loads, and electrical service circuit.

2.3 Power Interface Modules

A power interface module includes, for example: a mechanical enclosure; an internal controller that monitors the status and performance and commands the functioning of the module; a set of power electronic circuits; a set of signal conditioning circuits; a set of electrical connectors to connect to the busbar power strip; a set of connection switches (electromechanical, solid-state switches, or a combination) to dynamically connect, disconnect, and reconfigure the connection to a subset of power rails in the busbar power strip; a metal plate or heatsink (e.g. aluminum) to transfer heat from the power management circuits to the heat exchanger; and a set of attachment points arranged on the mechanical enclosure and configured to constrain the power interface module within the module interface region and in contact with the set of power rails and the heat sink. In one variation, the power interface module is constrained in contact with the power rails and the heat exchanger via a magnetic connector. On other embodiments, screws, clips or other fixing devices are used to hold the modules in place in the panel. In some embodiments, each module may rest on a shelf while connected to the panel.

Generally, the system includes one or several power interface modules configured to: impermanently install in the module interface region of the housing; electrically couple via a set of electrical connectors to the power rails; and thermally couple to the heat exchanger arranged within the housing. The power interface modules can selectively connect to and disconnect from a subset of power rails according to commands received from the system controller via the communication bus. In one example, a power interface module is configured to: receive power from a first peripheral power source via a set of power rails; condition (or "transform") this input power into a different output voltage and current; and output the conditioned power to a second peripheral power source or load via the set of power rails as configured by the system controller. Furthermore, the power interface module transmits status data to the system controller and receives commands from the system controller via the communication bus. Additionally, the power interface module transfers heat generated during operation to the heat exchanger arranged within the housing.

Each power interface module is configured to connect to the set of rails and to receive, condition, deliver and/or interconnect power between any of the following: electrical service, peripheral power systems, other power interface modules, and loads.

In particular, each power interface module is configured to: impermanently install in the module interface region in conjunction with concurrent installation of a peripheral power source or load in the building; and to control and condition power supplied to and from this peripheral power source or load, other peripheral power source, and the electrical service into the building based on control commands sent to the communication bus by the system controller.

Furthermore, the power interface module is configured for removal and replacement with a higher-capacity variant of the same power interface module type when the corresponding peripheral power source and/or load is upgraded (e.g., when an additional solar array or an additional backup battery is installed in the building). Furthermore, the power interface module is configured for removal and replacement with a power interface module of a different type when the corresponding peripheral power source and/or load is removed from the building and replaced with a peripheral power source and/or load of a different type.

2.4 System Controller

The system controller is connected to the busbar power strip and to all the power interface modules. The system controller can also connect to peripheral power sources, loads, building circuits, and electrical service via the communication module. The system controller is configured to: monitor voltages, currents, and temperatures in the system; and manage power flow and power requests from peripheral power sources (e.g., solar array, backup battery, electric vehicle battery pack, fuel cell, electrolyzer, gas generator, etc.), loads, and electrical service, by sending commands to the internal controllers in the power interface modules via the communication bus. The system controller also commands the internal controllers in the power interface modules to connect, disconnect, or reconnect to other power rails. This function allows dynamic reconfiguration of the electrical panel (or the power system thereof) to engage connectivity between active power sources, power interface modules, and loads that require energy. Therefore, the system controller manages the configuration of the entire system, by defining the connection between the power interface modules, the building circuits, the electrical service, the peripheral power sources, and loads, through the power rails in the busbar power strip.

For example, once the system is installed in a building and electrical service is first supplied to the system, the system controller can: power up using the electrical service; supply DC power to the installed power interface modules via the communication bus; read unique identifiers (e.g., Universal Identification values) from these power interface modules via the communication bus; and identify types, configurations, power levels, and connectivity possibilities and limitations of each power interface module based on these unique identifiers and other data read from the power interface modules. The system controller can also perform communication handshaking with peripheral power sources and loads (e.g., from an electric vehicle battery pack), and attend power source requests (e.g., providing from a solar array system, and the electrical service). The system controller can then identify types and positions of the peripheral power sources and loads connected to the system based on: communication handshaking or electrical measurements, power supply requests, power source availabilities, and/or unique identifiers. The system controller can then automatically command each power interface module to connect to specific power rails in the busbar power strip to interface with the correct peripheral power sources, loads, or electrical service.

After automatically configuring the power interface modules, the system controller can: control power flow between the peripheral power sources, electrical service, and loads; monitor currents, voltages, and temperatures; exchange data packages based on mathematical functions of measurement (e.g., integral mathematical operation of the current, kWh consumption, etc.) to and from the peripheral power sources, power interface modules, electrical service, and loads; and selectively activate and configure the power interface modules to condition and route AC and DC electrical power between the electrical service, peripheral power sources, and loads based on one or a combination of user preferences, electrical service requests, peripheral power sources availability, and/or load demands. For example, the system controller can automatically manage: slow and fast electric vehicle battery charging via the electrical service, directly from connected solar arrays, and/or from a connected backup battery; charging a connected backup battery via the electrical service and/or connected solar arrays; and deliver power from connected solar arrays to a connected backup battery, and/or an electric vehicle battery pack, and/or the electrical service.

2.5 System Controller Functionality

In one implementation the system controller is connected to the busbar power strip and to the set of power interface modules. The system controller is configured: to transfer data in the communication bus connected to internal controllers in the power interface modules; to control power flow through the busbar power strip by commanding the power interface modules; trigger protection commands to stop or change the operating mode of the power interface modules; control power and data transfer between any two power interface modules and/or peripheral power sources or loads. The system controller communicates with an internal controller in a power interface module to: detect the power interface module connected to the set of rails; execute a handshake with the power interface module to identify the connected power interface module; monitor and/or measure the electrical load on the power interface module; receive data from the power interface module; and send commands to the power interface module. The system controller also can: detect a peripheral power source or load connected to the busbar power strip; monitor and/or measure the electrical load on the peripheral power source or load connected to the busbar power strip; and transmit commands to the peripheral power source or load. Further, the system controller is configured: to selectively connect or disconnect the power interface module and the busbar power strip.

In one example, the system controller detects two power interface modules connected to the set of power rails of the busbar power strip. The system controller transmits a query requesting identifying information to the newly connected modules via the communication bus. In response to the query, the power interface modules return an identification message to the system controller identifying the first power interface module as a power inverter module (bidirectional) and the second power interface module as a DC/DC converter module (bidirectional). The power inverter module and the DC/DC converter module combined can charge and discharge a backup battery. The system controller identifies the power inverter module based on the received identification message and commands the power inverter module to connect to the electrical service and to the DC/DC converter module through the busbar power strip. The system controller also identifies the DC/DC converter module based on the received identification message and commands the converter to connect to the power inverter module and to a peripheral power source (backup battery) through the busbar power strip. The system controller also transmits configuration instructions and data to the power inverter module to work as an active rectifier and the DC/DC converter module to charge the backup battery. The system controller monitors and controls the charging process of the backup battery, communicates with the battery management system (BMS), controls and monitors power flow in the busbar power strip, and records electrical performance data over time. Further, the system controller can execute a detection routine at regular intervals or asynchronously to monitor the connection and disconnection of power interface modules. For example, in response to the removal of the DC/DC converter module, the system controller detects the absence of the DC/DC converter module during the detection routine and updates the status information.

In one variation of this example, the system controller transmits the query to the connected power interface module, in response to received user input to detect and configure a connected power interface module. In another variation, the system controller detects a unique identifier present in the power interface module and reads information from the unique identifier to identify the connected power interface module automatically.

2.6 Communication Module

In one variation of this implementation, the system controller further includes a communication module configured to transmit data to, and receive data from, an external device or system. The communication module can stream data, intermittently push data at regular intervals, or transmit data in response to a request.

In one implementation, the communication module is included as part of the system controller and configured to broadcast messages to, and receive messages from, an external system via an external data connection (e.g., an Ethernet connection, wireless connection, CAN bus). In one variation, the communication module can establish a direct connection with a peripheral power system, such as a user handheld device, via a wireless network (e.g., Wi-Fi™, Bluetooth™).

2.7 Heat Exchanger

The heat exchanger is: arranged in the housing; thermally coupled to the module interface region; and configured to extract thermal energy from power interface modules and the housing more generally during operation. Generally, the heat exchanger is configured to connect to other external fluid or gas transfer components (e.g., a discrete radiator and fluid loop; a residential water supply plumbing system; forced air) and cooperates with these external fluid/gas transfer components to define a cooling system. In one implementation, the cooling system defines an open system connected to a water supply plumbing system in the building such that water entering the building flows through the liquid heat exchanger before entering a radiator, entering a water heater, or flowing to a faucet, toilet, or showerhead. In another implementation, the cooling system defines a closed-loop system including a liquid heat exchanger, a chiller (i.e., a radiator), and a pump—commanded by the system controller—that moves fluid between the liquid heat exchanger and the chiller to extract heat from the housing.

In another implementation, the cooling system is configured to selectively: load cool water from a water source into a temporary closed-loop system; circulate this water to extract heat from the module interface region and heat the water; transfer this heated water from the closed-loop system to an external fluid transfer component within the building, such as a water heater or faucet, based on real-time hot water demand; and refill the closed-loop system with cool water from the water source. In this implementation, the system can also monitor water temperature and pressure within the closed-loop system, detect demand for hot water and/or for additional cooling within the module interface region, and selectively switch a set of valves to transfer hot water out of the closed-loop system and refill the closed-loop system with cool water to meet detected hot water and cooling demands.

In yet another implementation, the cooling system is configured to: connect the inlet and outlet of the cooling system to an air duct or pipe for natural convection cooling using air; or connect to a duct or pipe for forced air cooling with a fan that is commanded by the system controller.

Figure 4:
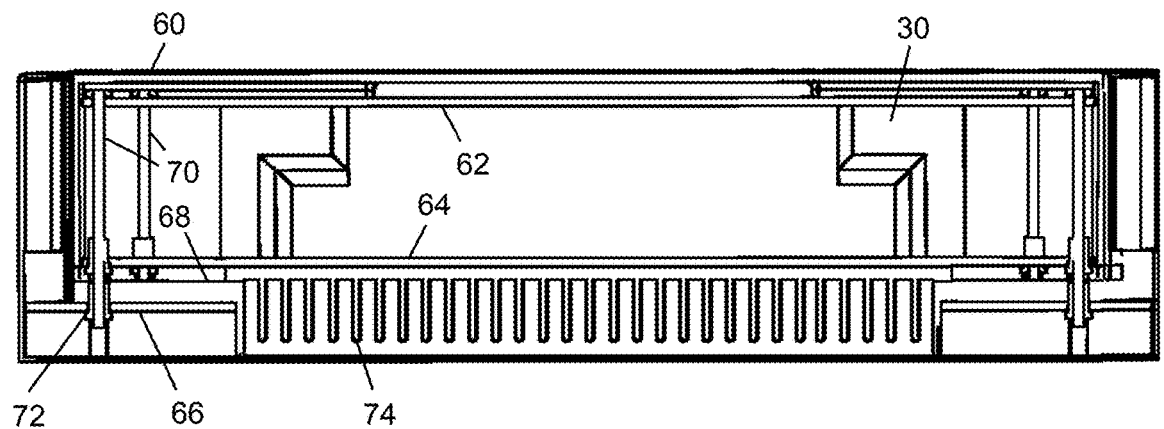
FIG. 4 is a cross-sectional view of a power interface module connected to rails of an air-cooled electrical panel, according to an embodiment of the present invention.

Referring to FIG. 4, an air-cooled power interface module is shown with enclosure 60, in which there is an upper circuit board 62 and a lower circuit board 64. The busbar power strip 66 is located within an enclosure 68, as part of the panel. Multi-board high-current connectors 70 connect the upper and lower circuit boards to the busbar power strip, via connectors 72. The connectors may include a plug on the module and a corresponding socket on the busbar power strip. A finned heatsink 74 is mounted on a back of the power interface module, the back side being the innermost side of the module with respect to the module's position inside the panel. When the module is mounted in the panel, the fins of the heatsink project into the heat-exchanging zone 17. As such, the modules are in direct thermal contact with the heat-exchanging zone, rather than being indirectly thermally connected thereto via other components or zones, or by simply being present in the casing of the electrical panel. Recesses 30 are defined in the outside surface of the module, which allow for the module to be gripped as it is inserted into or removed from the panel.

While the plugs are shown on the back of the power interface module, they may be located elsewhere, for example at the sides. The plugs and/or the enclosure of the power interface module may be arranged so that the module may be inserted into the panel in only one orientation.

Figure 5:
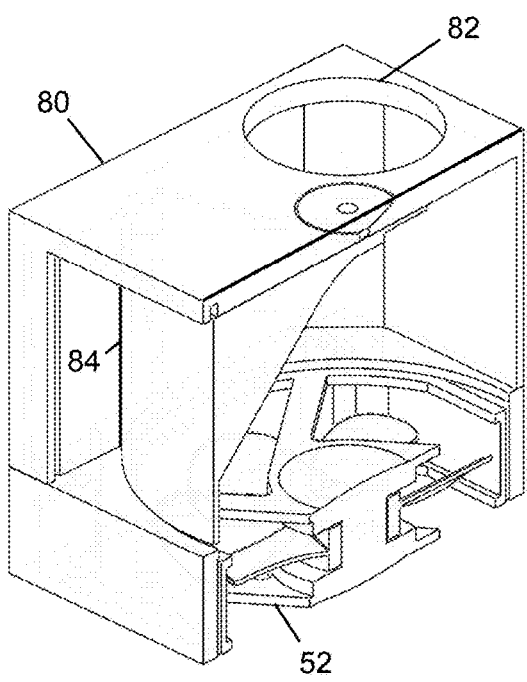
FIG. 5 is a cut-away perspective view of an air diverter for an electrical panel in a first setting, according to an embodiment of the present invention.
Figure 6:
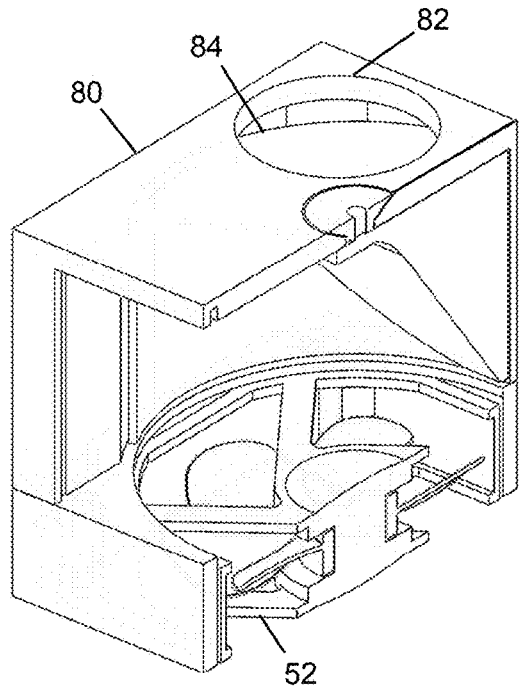
FIG. 6 is a cut-away perspective view of the air diverter in a second setting, according to an embodiment of the present invention.

Referring to FIGS. 5 and 6, an air diverter 80 is shown, which is mounted inside the casing of the electrical panel when it is air-cooled. The fan 52 is shown at the entrance of the air diverter. A rotatable closure member 84 is rotatable to either block or open the outlet 82 of the air diverter. The outlet 82 is aligned with the outlet 16A (FIG. 1), 16B (FIG. 3) in the upper wall of the casing of the panel. The front of the air diverter, not visible here, can be opened or closed to the secondary outlet 54 (FIG. 3) in the front cover or door of the panel when the closure member rotates. In FIG. 5, the outlet 82 is open to the fan by the setting of the closure member, whereas in FIG. 6, it is blocked as the closure member is set in a different rotational position.

Figure 7:
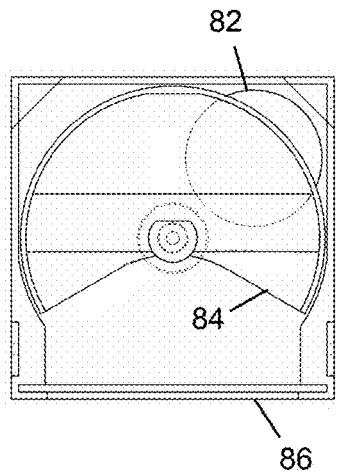
FIG. 7 is a bottom view of the air diverter in a third setting, according to an embodiment of the present invention.
Figure 8:
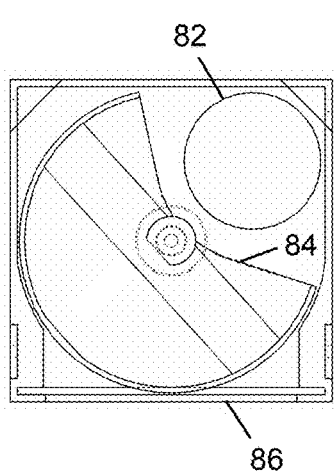
FIG. 8 is a bottom view of the air diverter in the first setting, according to an embodiment of the present invention.
Figure 9:
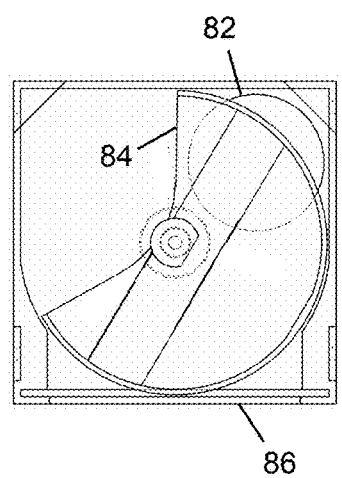
FIG. 9 is a bottom view of the air diverter in the second setting, according to an embodiment of the present invention.

Views of the air diverter from below are shown in FIGS. 7-9. In FIG. 7, the closure member 84 is set so that air drawn into the diverter is directed out through the front 86 of the diverter, therefore into the room in which the panel is installed. The outlet 82 is blocked, so that no air is directed out through the top wall of the panel and to the outside of the building in which the panel is installed. In FIG. 8, the closure member 84 is set so that air drawn into the diverter is directed out through the outlet 82 of the diverter, and therefore to the outside of the building in which the panel is installed. The front 86 of the diverter is blocked, so that no air is directed into the room in which the panel is installed. In either of the two preceding settings, the fan may be on for forced convection cooling, or off for natural convection cooling. In FIG. 9, both the outlet 82 and the front 86 of the diverter are blocked by the closure member 84. In this setting, the fan is switched off, and cooling of the power interface modules is not required. A person skilled in the art may recognize that there is a range of angles for the closure member 84 that allows air to flow partially through both outlet 82 and the front 86 simultaneously. In another example, a second outlet is included in the diverter to vent air in the building into the heat recovery ventilation (HRV) or the forced air furnace ducts.

Figure 10:
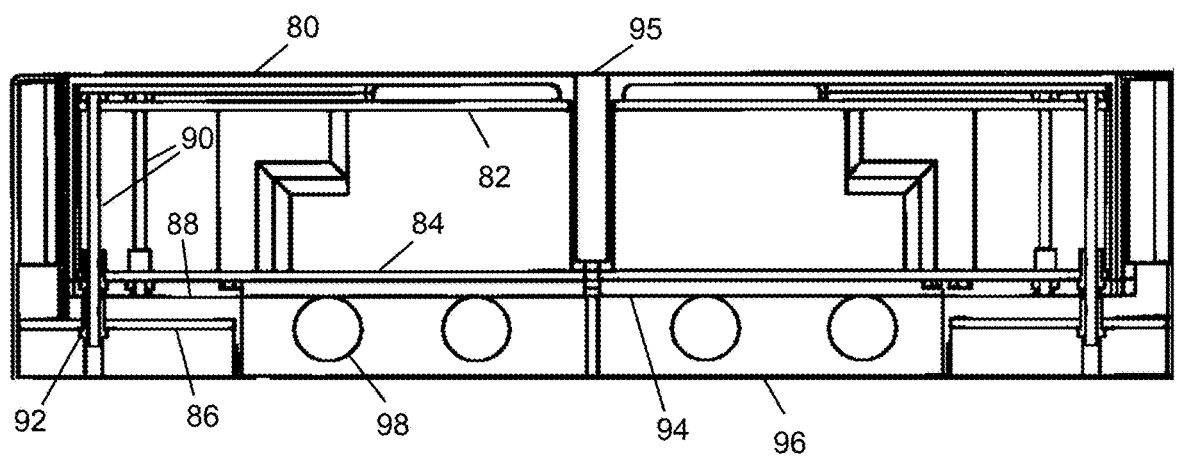
FIG. 10 is a cross-sectional view of a power interface module connected to rails of a liquid-cooled electrical panel, according to an embodiment of the present invention.

Referring to FIG. 10, a liquid-cooled power interface module is shown with enclosure 80, in which there is an upper circuit board 82 and a lower circuit board 84. The busbar power strip 86 is located within an enclosure 88 as part of the panel. Multi-board high-current connectors 90 connect the upper and lower circuit boards to the busbar power strip, via connectors 92. A cold plate 94 is mounted on a back of the power interface module. When the module is mounted in the panel, a screw passes through screw hole 95 to hold or constrain the module in direct thermal contact with the heat exchanger 96. As such, the modules are in direct thermal contact with the heat-exchanging zone, rather than being indirectly thermally connected thereto via other components or zones, or by simply being present in the casing of the electrical panel. The term "direct contact" includes contact via a thermal paste, grease or other equivalent substance that may be included between the cold plate and the heat exchanger. The heat exchanger is mounted in the electrical panel in the heat-exchanging zone 17, such that coolant can flow from the coolant inlet, through the channels 98, and out through the coolant outlet.

The sockets allow for enough positional tolerance so that the modules can be adjusted for good thermal connection to the heat exchanger, for example. The sockets may be arranged in identical sets, so that each set of sockets can accept the same power interface module. The sets of sockets may also be equally spaced.

2.8 Modularity

The system can function as a modular, reconfigurable power system and electrical panel that: houses breakers that distribute energy to individual AC circuits within a building; houses breakers that distribute energy to backup individual AC circuits within a building; houses switchgear; connects to peripheral power sources; houses a system controller; houses one or multiple power interface modules that connect electrically through a busbar power strip and are thermally coupled to a heat exchanger; distributes energy from and to the electrical service, peripheral power sources, other power interface modules, and loads in the building; and autonomously reconfigures the interconnection of the power interface modules to modify the power distribution to and from the electrical service, peripheral power sources, other power interface modules, and loads in the building.

The system further includes multiple slots, configured to accept power interface modules that can be inserted by a user (e.g., homeowner, installer) to upgrade or modify the system over time. The inserted power interface modules support a variety of peripheral power sources and loads, thereby enabling unique combinations of sources, loads, and power rating required by users. While users or homeowners may replace or exchange modules, an electrician will be required to modify any of the hardwiring to the switchgear.

Each power interface module may have the same overall size and shape, i.e. the same envelope, so that any module can be inserted into any position in the panel. Some modules may be larger, e.g. twice the size of the other modules, but, by the arrangement of their plugs, it is still possible to connect them to the panel in multiple different locations.

2.9 Busbar Power Strip

In one implementation, the busbar power strip (or power strip) carries a set of electrical connectors and electrical distribution rails (e.g., AC and DC power rails). A first subset of the electrical connectors is coupled to a set of power rails. The busbar power strip is configured to enable power transfer between peripheral power sources and loads using power interface modules. Peripheral power sources and loads connect to the power rails via switchgear and the power rails connect to the power interface modules via the electrical connectors.

In one example, a solar array is connected to a first power rail in the busbar power strip via switchgear, a backup battery is connected to a second power rail in the busbar power strip via switchgear, and an electric vehicle is connected to a third power rail in the busbar power strip via switchgear. A DC/DC converter module (bidirectional, isolated) is arranged in the module interface region and connected to the first power rail via a first connector, to the second power rail via a second connector, to the third power rail via a third connector. At a first time, the system controller: detects the DC/DC converter module, backup battery and solar array; sends a command to the DC/DC converter module via the communication bus to selectively connect the DC/DC converter module input to the solar array via the first connector and the first power rail and the DC/DC converter module output to the backup battery via the second connector and second power rail; and sends a command to the DC/DC converter module via the communication bus to condition its output voltage/current for that particular backup battery. The DC/DC converter module feeds from the first power rail and supplies power to the second power rail to charge the backup battery.

In this example, at a later time, the system controller: detects a full charge of the backup battery; and thus sends a command to the DC/DC converter module via the communication bus to disconnect from the second connector and connect to the third connector. The DC/DC converter module takes power from the first power rail (connected to the solar array) and supplies the conditioned power to the electric vehicle battery pack that is connected to the third power rail, thereby charging the electric vehicle battery pack with energy captured by the solar array.

Therefore, the busbar power strip provides the interconnectivity needed by the power interface modules to selectively switch to transmit power between devices (power sources, electrical services, loads, and other power interface modules) based on present conditions and in response to commands received from the system controller. The busbar power strip also allows the system to selectively configure an electrical circuit between a first peripheral power source (such as a backup battery) and a second peripheral power source (such as an electric vehicle battery pack) based on receipt of a control signal from an external system (e.g., a user device).

As an example, having five sets of rails is suitable for most residential use cases. However, three sets may be enough for a simple application. Since the power rails are implemented with a multilayer PCB (printed circuit board), more rails may be added for complex applications (the PBC can have 10 layers for example). The limitation on the number of rails is given by the size of the connectors (left and right) and the volume of the switchgear as it grows with the number of rails.

As the system is designed to be DC coupled, there is usually a central DC set of rails (e.g. 400V) to which most of the modules are connected. The power rails are constructed with the same type of material, so that they can be interchangeable.

However, there could potentially be a minimalistic system such as a grid connected PV system. In this case there would be one rail to connect to the PV array, and from that rail a solar controller (DC/DC module) would transfer the power to a second rail of 400V, and from that rail an inverter would transfer the power to the grid through a third rail. This would be, therefore, a system with only three rails. However, a busbar with only three rails or sets of rails is relatively restrictive in terms of the modularity and reconfigurability of the system, compared to a busbar with more rails.

3. Power Interface Module Implementation

In one implementation, the module interface region impermanently accepts a set of power interface modules. The power interface modules are one of the following types: a DC/DC converter module; an inverter module; a rectifier module; an interconnection module; or a combo interface module that combines one or more DC/DC converters, inverters, rectifiers, and interconnections modules inside one power interface module.

Generally, a power interface module receives power from a first peripheral power source (e.g., utility, a solar array, a backup battery, a generator, a fuel cell) and/or electrical service, converts and delivers power to a second peripheral power source (e.g., a backup battery, an electric vehicle battery pack), electrical service, or load (e.g., an electrolyzer). Alternatively, a first power interface module receives power from a second power interface module, converts and delivers power to a peripheral power source, electrical service, or load. Further, the first power interface module receives power from a peripheral power source and/or electrical utility, converts and delivers power to a second power interface module. Generally, a power interface module is thermally connected to the heat exchanger via a metal plate or heat sink.

In one variation, the power interface module further includes a direct external power connector, and a peripheral power source or load is connected directly to the power interface module via the direct external power connector, bypassing the busbar power strip.

In one variation, each power interface module has at least one input and output and could have multiple inputs and multiple outputs.

Therefore, a power interface module can: selectively locate within the module interface region, connect to the system controller via a communication bus, connect electrically via a set of rails in the busbar power strip to peripheral power sources, electrical services, other power interface modules, and/or loads; receive, convert and deliver power; and receive and transmit data via the communication bus, the set of rails and/or power lines. Optionally, a power interface module can interconnect or disconnect a subset of the power rails.

The system controller provides the commands to activate at least some of the relays in the power interface modules, irrespective of the number of relays. A higher number of relays will increase the interconnection capabilities for each power interface module. For example a typical inverter module has three relays: one for the DC side (2 poles, positive and negative) one for AC line L1 and one for AC line L2. The commutation mechanism allows the module to connect to any desired power rail that is possible to connect to that particular module.

Figure 12:
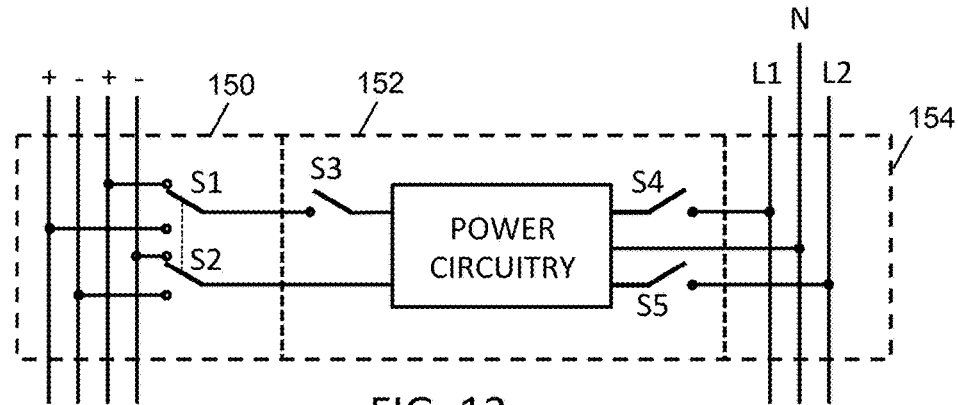
FIG. 12 is a schematic wiring diagram of a power interface module, according to an embodiment of the present invention.

For example, FIG. 12 shows an inverter and a busbar with two DC rails and one two-phase AC rail. The power module inside has three regions: the region on the left is the interconnection mechanism for the DC side 150 which could be achieved with a double pole double throw relay or equivalent (relays S1 and S2), the middle region 152 is the converter itself which has a relay S3 for the positive conductor on the DC side and two relays (relay S4 and S5) one for each phase in the AC side 154. The command to connect/disconnect for the power rails connection (commutation region, relays S1 and S2) comes from the microcontroller (i.e. internal controller) in the power interface module that controls the module as a result of a command received from the system controller. However, the decision to connect/disconnect the relays that are in the middle region, i.e. relays S3, S4 and S5, is taken autonomously by the module.

The useful minimum number of modules is, in general, two: for example, an inverter and a solar controller or an inverter and a battery charger. However, one module alone may have enough functionality for simple applications. For example, charging an EV from a solar PV with only one module.

As an example, the battery charger and the EV DC charger functions may be performed with one module if properly designed. In this case, as the battery is permanently connected to a set of power rails, different than the EV, then the panel would commutate the rails daily, for example. Users that want to save money may use this option, due to lower initial investment.

3.1 DC/DC Converter Module

In one variation, the DC/DC converter module connects to a first DC peripheral power source and a second DC peripheral source (or load) via the set of rails in the busbar power strip and is managed by an internal controller and the system controller. The DC/DC module is configured to: impermanently install in the module interface region; receive power from a first DC peripheral source; convert (e.g., transform) power; deliver conditioned power to a second DC peripheral power source (or load); and monitor the status and performance of the first DC peripheral power source and the second DC peripheral power source (or load). The DC/DC converter module transfers the conditioned power via the set of DC-power rails or a direct external connector.

In general, the DC/DC converter modules can have typical configurations such as isolated, non-isolated, unidirectional, bidirectional, one input, one output, multiple inputs, and/or multiple outputs. For example, a unidirectional non-isolated DC/DC converter module can connect to multiple inputs and one output via the set of rails in the busbar power strip. In this example, two or more solar arrays connect to the input of the DC/DC converter module and a backup battery connects to the output, thus creating a multiple-input, single-output solar battery charging system. Alternatively, a unidirectional isolated DC/DC converter module can connect to one input and multiple outputs via the set of rails in the busbar power strip. In this example, one solar array connects to the input of the DC/DC converter module and two or more electric vehicle battery packs connect to the output, thus creating a single-input, multiple-output solar electric vehicle battery charging system. The connectivity of the DC/DC converter module is determined by commands from the system controller to connect to specific power rails in the busbar power strip to interface with the correct peripheral power sources, loads, and/or electrical service. In addition to connecting to peripheral power sources, the DC/DC converter module can also connect to other power interface modules at the input and/or output.

3.2 Power Inverter Module

In one variation, the power inverter module connects to a first DC peripheral power source and a second AC peripheral power source (e.g. micro-grid), electrical service, and/or load via the set of rails in the busbar power strip and is managed by an internal controller and the system controller. The power inverter module is configured to: impermanently install in the module interface region; receive power from a first DC peripheral power source; convert (e.g., transform, invert) power; deliver conditioned power to a second AC peripheral power source, electrical service, and/or load; monitor the status and performance of the first DC peripheral power source; monitor the status and performance of the second AC peripheral source, electrical service, and/or load. The power inverter module transfers the conditioned power via the set of power rails or a direct external connector.

In general, the power inverter modules can have typical configurations such as unidirectional, bidirectional, one input, one output, multiple inputs, and/or multiple outputs. For example, a unidirectional inverter can connect to multiple inputs and one output via the set of rails in the busbar power strip and perform voltage source inverter functions. In this example, a backup battery connects to the input of the power inverter module and a set of AC loads with different voltages, such as 120V AC lights, 240V appliances, and 120V appliances, connect to the output, thus creating a single-input, multiple-output voltage source inverter system. Alternatively, a bidirectional power inverter module can connect to two or more inputs and one output (via the set of rails and busbar power strip). In this example, two or more AC peripheral power sources, such as a generator and electrical service, are connected to the power inverter module (AC side) and a battery pack connects to the inverter DC side, thus creating an inverter-charger system. The connectivity of the power inverter module is determined by commands from the system controller to connect to specific power rails in the busbar power strip to interface with the correct peripheral power sources, loads, and/or electrical service. In addition to connecting to peripheral power sources, the power inverter module can also connect to other power interface modules at the input and/or output.

3.3 Rectifier Module

In one variation, the rectifier module connects to a first AC peripheral power source (or electrical service) and a second DC peripheral power source (i.e. its input), and/or load via the set of rails in the busbar power strip and is managed by an internal controller and the system controller. The rectifier module is configured to: impermanently install in the module interface region; receive power from the first AC peripheral power source or electrical service; convert (i.e., rectify) power; deliver conditioned power to the second DC peripheral power source, and/or load; monitor the status and performance of the first AC peripheral power source (or electrical service); monitor the status and performance of the second DC peripheral source, and/or load. The rectifier module transfers the conditioned power via the set of power rails or a direct external connector.

In general, the rectifiers can be active (power factor corrector) or passive rectifiers, single-phase, split-phase, or multiple-phase. For example, an active, single-phase rectifier module can connect to a single-phase generator at the input and condition power to supply DC loads, connected at the output to the same DC bus, such as a DC residential lighting system and IT (information technology) equipment, and perform DC distribution rectification functions. In another application, a three-phase active rectifier module connects to a three-phase generator at the input and a backup battery at the output (via the set of rails and busbar power strip), thus performing three phase battery charging functions. The connectivity of the rectifier module is determined by commands from the system controller to connect to specific power rails in the busbar power strip to interface with the correct peripheral power sources, loads, and/or electrical service. In addition to connecting to peripheral power sources, the rectifier module can also connect to other power interface modules at the input and/or output.

3.4 Interconnection Module

The interconnection module connects to some or all power rails in the busbar power strip using a set of electrical connectors and is managed by an internal controller and the system controller. The interconnection module is configured to: impermanently install in the module interface region; use switches (electromechanical, solid-state switches, manual wire/jumper, or a combination) to dynamically connect, disconnect, and reconfigure an active connection between two or more subsets of power rails in the busbar power strip. The connectivity of the interconnection module is determined by commands from the system controller to connect to specific power rails in the busbar power strip to establish an active connection between other power interface modules, peripheral power sources, loads, and/or electrical service. The interconnection module transfers the conditioned power via the set of power rails or a direct external connector.

Generally, an interconnection module electrically connects a first set of power rails to a second set of power rails. Alternatively, an interconnection module can isolate a first set of power rails and a second set of power rails. Also, the interconnection module can limit the current that flows through a power rail (e.g., inrush current limiting function).

In one variation, the interconnection module can connect one or more sets of power rails to one or more other sets of power rails. For example, the connection of two or more power rails can increase the electrical current capacity of the busbar power strip for applications that require higher current. In another example, an interconnection module connects to all of the power rails.

3.5 Combo Interface Module

A combo interface module combines two or more of the following elements: DC/DC converters, inverters, rectifiers, and/or interconnection modules inside one power interface module. In one variation, the combo interface module connects to a first DC or AC peripheral power source (or electrical service) and a second DC or AC peripheral power source (electrical service, and/or load) via the set of rails in the busbar power strip and is managed by an internal controller and the system controller. The combo interface module is configured to: impermanently install in the module interface region; receive power from the first DC or AC peripheral power source or electrical service; convert (e.g., transform, invert, rectify) power; deliver converted power to the second DC or AC peripheral power source, electrical service or load; and monitor the status and performance of the first peripheral power source, and/or electrical service and the second peripheral power source, electrical service, and/or load. The combo interface module transfers the converted power via the set of power rails or a direct external connector.

In general, a combo interface module can have typical configurations that include any two or more of the following: DC/DC converters that are isolated, non-isolated, unidirectional, bidirectional, one input, one output, multiple inputs, and/or multiple outputs; power inverters that are unidirectional, bidirectional, one input, one output, multiple inputs, and/or multiple outputs; rectifiers that are active (power factor corrector) or passive, single-phase, split-phase, or multiple-phase rectifiers; interconnection modules with electromechanical, solid-state switches, manual wire/jumper, or a combination. The connectivity of the combo interface module is determined by commands from the system controller to connect to specific power rails in the busbar power strip to interface with the correct power interface module, peripheral power sources, loads, and/or electrical service. In addition to connecting to peripheral power sources, the combo interface module can also connect to other power interface modules at the input and/or output.

For example, a combo interface module can combine a bidirectional single-phase inverter in series with a bidirectional non-isolated DC/DC converter inside one interface module. In one implementation, the combo interface module connects to a backup battery and to the electrical service via the set of rails in the busbar power strip. The combo interface module is configured to: receive power from the electrical service and deliver power to the backup battery (i.e., to charge the backup battery), acting as a battery charger. The combo interface module is further configured to receive power from the backup battery and deliver power to the electrical service acting as a grid-tied inverter and/or deliver power to AC backup loads.

For example, in response to detection of low power demand in the building electrical circuits and low power cost rates, the system controller configures the combo interface module to connect to the electrical service and a backup battery to transfer power from the electrical service to the backup battery. Additionally, the combo interface module monitors the changing process and follows a charging profile. At a second time, in response to the charge level of the backup battery exceeding a threshold, the combo interface module enters stand-by mode or floating mode. At a third time, in response to the detection of a loss of electrical service, the system controller sends a command signal to the combo interface module to connect to the AC electrical loads (backup) and the backup battery to transfer power from the backup battery to the building backup electrical circuits. In this operating mode, the backup electrical circuits are islanded from the electrical utility by a backup circuit breaker.

4. System Implementation

Figure 11:
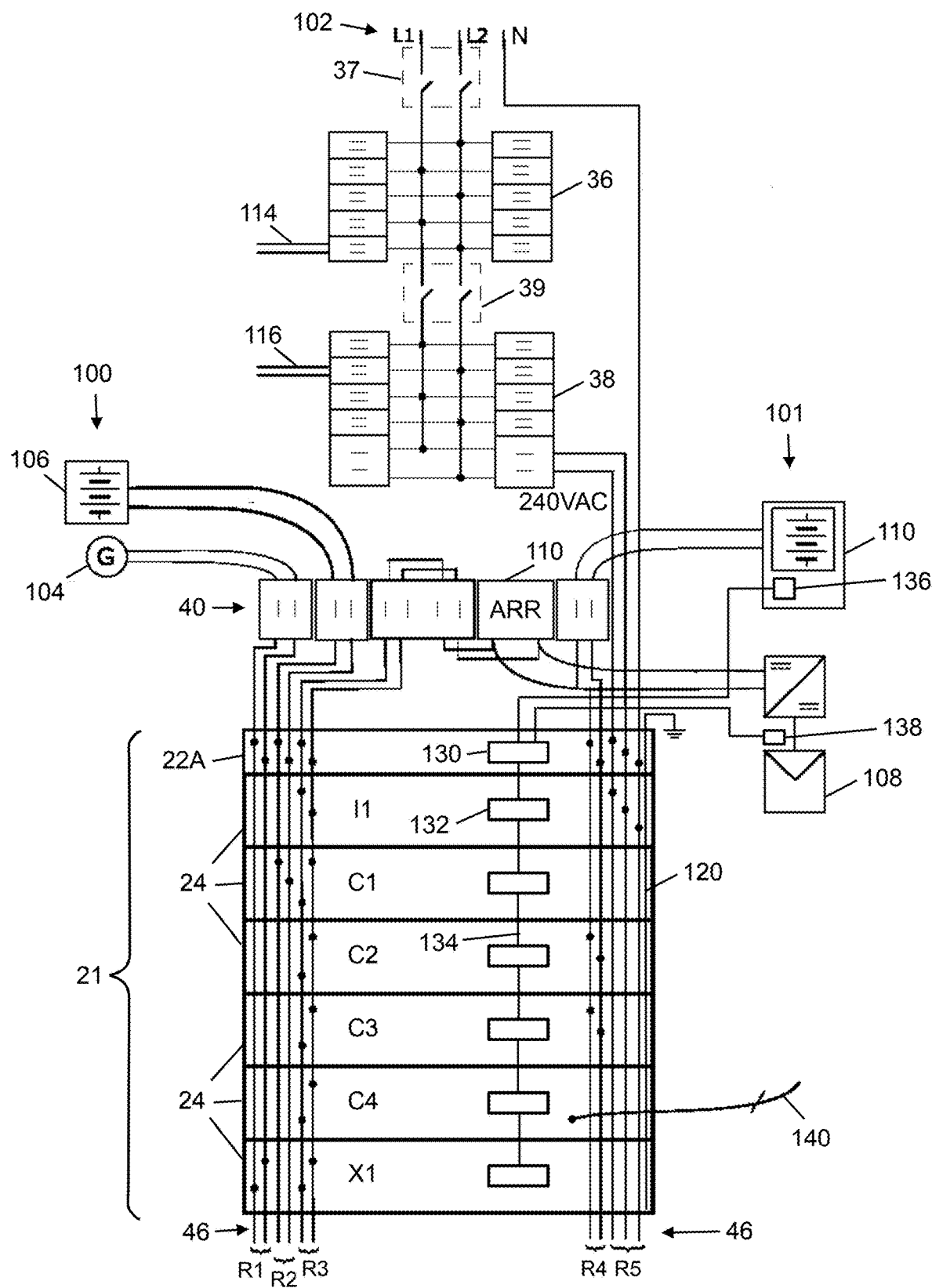
FIG. 11 is a schematic wiring diagram of an electrical panel, according to an embodiment of the present invention.

In one implementation, as shown in FIG. 11, the module interface region 21 impermanently accepts a set of power interface modules 24: power inverter module 11, DC/DC converter module C1, DC/DC converter module C2, DC/DC converter module C3, DC/DC converter module C4, and rectifier module X1. A set of peripheral power sources 100, 101 and electrical service 102 are connected to the power rails 46 via the switchgear 40: AC generator 104 to rail R1, backup battery pack 106 to rail R2, solar array 108 with optimizers to rail R3, electric vehicle 110 to rail R4, electrical service 102 to rail R5. The system controller 22A (or central controller) detects the power interface modules, electrical service, and peripheral power sources and configures the system to connect: rail R3 and rail R5 to the power inverter module 11, rail R2 and rail R3 to the DC/DC converter module C1, rail R3 and rail R4 to the DC/DC converter module C2, rail R3 and rail R4 to the DC/DC converter module C3, rail R3 and external connector 140 to DC/DC converter module C4, rail R1 and rail R3 to the rectifier module X1. While each of the plugs of the power interface modules is electrically connected to a power rail, internal switches within the power interface modules may break or make the electrical connection of the power circuitry within the module to the plugs. The peripheral DC power sources may be connected directly to the electrical panel without an intervening DC/DC converter.

Six modes of operation are defined for this implementation: power export to the electrical service, backup mode for AC loads, backup mode for DC loads, electric vehicle battery charging, backup battery charging, and full mode of operation.

When power export to the electrical service is performed the power flows: from the AC generator through rectifier module X1 and through power inverter module 11 injecting power into the electrical service; and/or from the backup battery 106 through DC/DC converter module C1 and through power inverter module 11 injecting power into the electrical service; and/or from the electric vehicle battery pack 110 through DC/DC converter C2/C3 and through power inverter module 11 injecting power into the electrical service; and/or from the solar array with DC optimizers 108 through the power inverter module 11 injecting power into the grid.

When the backup mode for AC loads is performed the power flows: from the AC generator 104 through rectifier module X1 and through power inverter module 11 delivering power to the AC loads via circuits 114, 116; and/or from the backup battery through DC/DC converter module C1 and through power inverter module 11 delivering power to the AC loads; and/or from solar array with DC optimizers through power inverter module 11 delivering power to the AC loads; and/or the electric vehicle battery pack through DC/DC converter C2/C3 and through power inverter module 11 delivering power to the AC loads. Under backup mode, the electrical service 102 is disconnected by a contactor or breaker 37 or 39 depending on whether the critical circuits 116 or both the critical circuits and the general building electrical circuits 114 are powered.

When backup mode for DC loads is performed, the power flows: from the AC generator through rectifier module X1 and through DC/DC converter module C4 delivering power to the DC loads; and/or from the backup battery through DC/DC converter module C1 and through DC/DC converter module C4 delivering power to the DC loads; and/or from solar array with DC optimizers through DC/DC converter module C4 delivering power to the DC loads; and/or from the electric vehicle battery pack through DC/DC converter C2/C3 and through DC/DC converter module C4 delivering power to the DC loads.

When the electric vehicle battery charging mode is performed, the power flows: from the electrical service through power inverter module 11 (operating in rectification mode) and through DC/DC converter C2/C3 delivering power to the electric vehicle battery pack; and/or from the backup battery through DC/DC converter module C1 and through DC/DC converter C3 delivering power to the electric vehicle battery pack; and/or from the AC generator through rectifier module X1 and through DC/DC converter C2/C3 delivering power to the electric vehicle battery pack; and/or from the solar array with DC optimizers through DC/DC converter C2/C3 delivering power to the electric vehicle battery pack.

When the backup battery charging mode is performed, the power flows: from the electrical service through power inverter module 11 and through DC/DC converter module C1 delivering power to the backup battery; and/or from the AC generator through rectifier module X1 through DC/DC converter module C1 delivering power to the backup battery; and/or the electric vehicle battery pack through DC/DC converter C2/C3 through DC/DC converter module C1 delivering power to the backup battery; and/or solar array with DC optimizers through DC/DC converter module C1 delivering power to the backup battery.

When the electrical service is present, the full mode of operation can be performed which includes the first five modes of operation (power export to the electrical service, backup mode for AC loads, backup mode for DC loads, electric vehicle battery charging, backup battery charging), in addition to power flow: from the electrical service to the AC loads; and/or the electrical service through power inverter module 11 and through DC/DC converter module C4 to supply DC loads.

In the system controller 22A there is a communications module 130 that is connected to other communications modules 132 in each of the power interface modules 24, all connected by a communications bus 134. The communications bus is mounted, for example, on the same board as some of the power rails 46. The earth connection 120 may also run along the busbar power strip for connection to the power modules. The communications module 130 in the system controller may be connected (wired or wirelessly) to communications modules 136, 138 in the peripheral power sources and/or loads 100, 101.

The implementation described in this section serves as an example, and multiple variations are possible with the modular, reconfigurable power system and electrical panel described in this disclosure.

4.1 Parallel Connection of Power Interface Modules

The implementation in FIG. 11 shows an example of parallel connection of power interface modules. In this particular case, DC/DC converter module C2 and DC/DC converter module C3 are connected in parallel to enable a higher power rating and redundancy compared to the use of a single DC/DC converter module. The electric vehicle battery pack can be charged/discharged faster when supplied with more than one power interface module. As well, the system reliability increases with redundant power interface modules. In general, the system allows parallel connection of any of the power interface modules to increase power rating and create redundancy.

4.2 Power Interface Module Powering Multiple Peripheral Power Sources

For example, the system is configured to charge two or more electric vehicle battery packs using one bidirectional power inverter module and one isolated DC/DC converter. In response to a first electric vehicle connected to the system, the system controller: executes a handshake with the first electric vehicle to identify the connected first electric vehicle; the system controller connects the power inverter module to the electrical utility and to the input of an DC/DC converter module using the busbar power strip; the system controller also connects the output of the DC/DC converter module to the first electric vehicle using the busbar power strip. The charging process can either follow a charging algorithm from the system controller or follow a charging algorithm controlled by the battery management system (BMS) from the electric vehicle battery pack. While the first electric vehicle is charging, a second electric vehicle connects to the system and waits to be charged.

In one implementation, the system controller keeps charging the first electric vehicle battery pack until the charge level exceeds a threshold. At that time, the system controller generates a notification to a user device, via the communication module, indicating that the connected first electric vehicle is charged. In response to a second electric vehicle connected to the system, the system controller: executes a handshake with the second electric vehicle to identify the connected second electric vehicle; connects the power inverter module to the electrical utility and to the input of the DC/DC converter module using the busbar power strip; and connects the output of the DC/DC converter module to the second electric vehicle using the busbar power strip to begin the charging process.

In another implementation, one power inverter module, and one DC/DC converter module are used to charge two or more electric vehicles in short intervals (e.g., 2 minutes per vehicle) or any pre-programmed sequence until all the electric vehicle battery packs are full. This low cost implementation can charge two or more electric vehicles by scheduling short interval charging sequences without the need to add more power interface modules. In general, the same principle applies to a collection of peripheral power sources and loads that can share the same power interface modules to perform cycle powering.

In another variation, one power inverter module, and one DC/DC converter are configured by the system controller to operate in backup mode in response to detecting a power outage in the electrical services. The bidirectional DC/DC converter connects to a first electric vehicle; conditions (i.e., transforms) power; and delivers power to the power inverter module. The power inverter module generates a sinusoidal output voltage to supply peripheral power sources and AC loads (e.g., building electrical circuits). Once the battery state of charge of the first vehicle reaches a certain discharge threshold, the system controller connects the DC/DC converter module to a second electric vehicle (using the busbar power strip) to follow the same discharge routine to supply peripheral power sources and AC loads. Further, if a backup battery is available, the system controller can connect the same DC/DC converter module to the backup battery output (using the busbar power strip) to continue to supply peripheral power sources and AC loads via the power inverter module. Under backup mode, the electrical service is disconnected by a contactor or breaker. In response to the system controller detecting a resumption of the electric service, the system controller sends a signal to the power inverter module and DC/DC converter module to cease drawing power from the backup battery and begins the process of recharging the backup battery and later the electric vehicle battery packs.

In another implementation, one power inverter module, and one DC/DC converter module are used to simultaneously charge one or more electric vehicle battery packs (cycle powering) and inject power into the electrical service from a solar array. The system controller configures both the DC/DC converter module and the power inverter module to connect to the solar array. The output of the DC/DC converter module connects to an electric vehicle and the output of the inverter connects to the electrical service. The system controller detects generation from the solar array and delivers power to the electric vehicle battery pack via the DC/DC converter module and also delivers power to the electrical service using the power inverter module.

These examples illustrate how the system is dynamically reconfigured to deliver power from and to multiple peripherals power sources, electrical service, and loads. These examples are illustrative and not exhaustive.

4.3 AC Generator Configuration

In one variation, one AC generator and one interconnection module are configured to provide backup power to AC loads. The system controller configures the interconnection module to connect a first set of power rails to a second set of power rails when there is a power outage. The connection is enabled by the system controller once the AC generator supplies stable voltage and frequency and connects the AC generator to the power rails via the interconnection module to supply backup AC loads. During a power outage, the system controller disconnects the electrical service by opening a backup breaker/contactor in the AC circuit breaker region. As an alternative arrangement, the backup breaker/contactor can also be placed within the interconnection module. The system controller monitors the operation of the AC generator and commands the interconnection module to disconnect if the voltage or frequency are out of range. Also, the system controller monitors the electrical service voltage and transfers the backup AC load back to the electrical service once the service is resumed. At that time, the interconnection module disconnects the AC generator. The generator deactivates to conserve fuel.

In another variation, one AC generator, one rectifier module, and one power inverter module are configured to provide backup power to AC loads and DC loads. The system controller configures the rectifier module to connect to the AC generator and the input of the inverter via the busbar power strip during a power outage. The rectifier converts the generator AC voltage into DC to supply DC loads and the inverter converts the DC voltage to AC to supply backup AC loads. During a power outage, the electrical service is disconnected by opening a backup breaker/contactor in the AC circuit breaker region. The system controller monitors the operation of the AC generator and commands the rectifier module to disconnect if the voltage or frequency are severely out of range. The generator voltage and frequency operating range can be wider given the regulation and conversion capabilities of the active rectifier. Also, the system controller monitors the electrical service voltage and transfers the backup AC load back to the electrical service once the service is resumed. At that time, the rectifier module disconnects the AC generator and commands the power inverter module to supply the DC load from the electrical service. The generator deactivates to conserve fuel.

In yet another configuration, one generator (variable frequency and amplitude), one backup battery, one rectifier module, one DC/DC converter module and one power inverter module are configured to provide backup power to AC loads and DC loads. The system controller executes a handshake with the generator to identify the high efficiency operating point (e.g., output power value with maximum efficiency for the generator). During a power outage, the system controller configures the rectifier module input to connect to the generator; configures the output of the rectifier module to connect to the input of the inverter; configures the output of the rectifier module to connect to the DC/DC converter module; the connections are done via the busbar power strip. Further, the system controller configures the DC/DC converter module to connect to the backup battery and the power inverter module to AC loads. The system controller monitors the operation of the generator and commands the rectifier module to maintain a high efficiency operating point. The DC/DC converter module discharges or charges the backup battery to balance the generator power generation and the AC and DC power consumption. That is, when the generator output is higher than the AC and DC loads, the excess energy is used to charge the backup battery. When the generator output is lower than the AC and DC loads, the energy deficit is supplied by the backup battery. The system controller commands the rectifier module, DC/DC converter module, and one power inverter module to achieve this balance. When the backup battery reaches a charge threshold, the generator is turned off. When the backup battery reaches a discharge threshold, the generator is turned on again. The combination of the generator and backup battery provides a hybrid backup energy system with higher efficiency than a conventional combustion engine generator. Also, the system controller monitors the electrical service voltage and transfers the backup AC load back to the electrical service once the service is resumed. At that time, the rectifier module disconnects the generator and commands the power inverter module to supply the DC loads from the electrical service. The generator deactivates to conserve fuel.

4.4 Block Diagram

Figure 13:
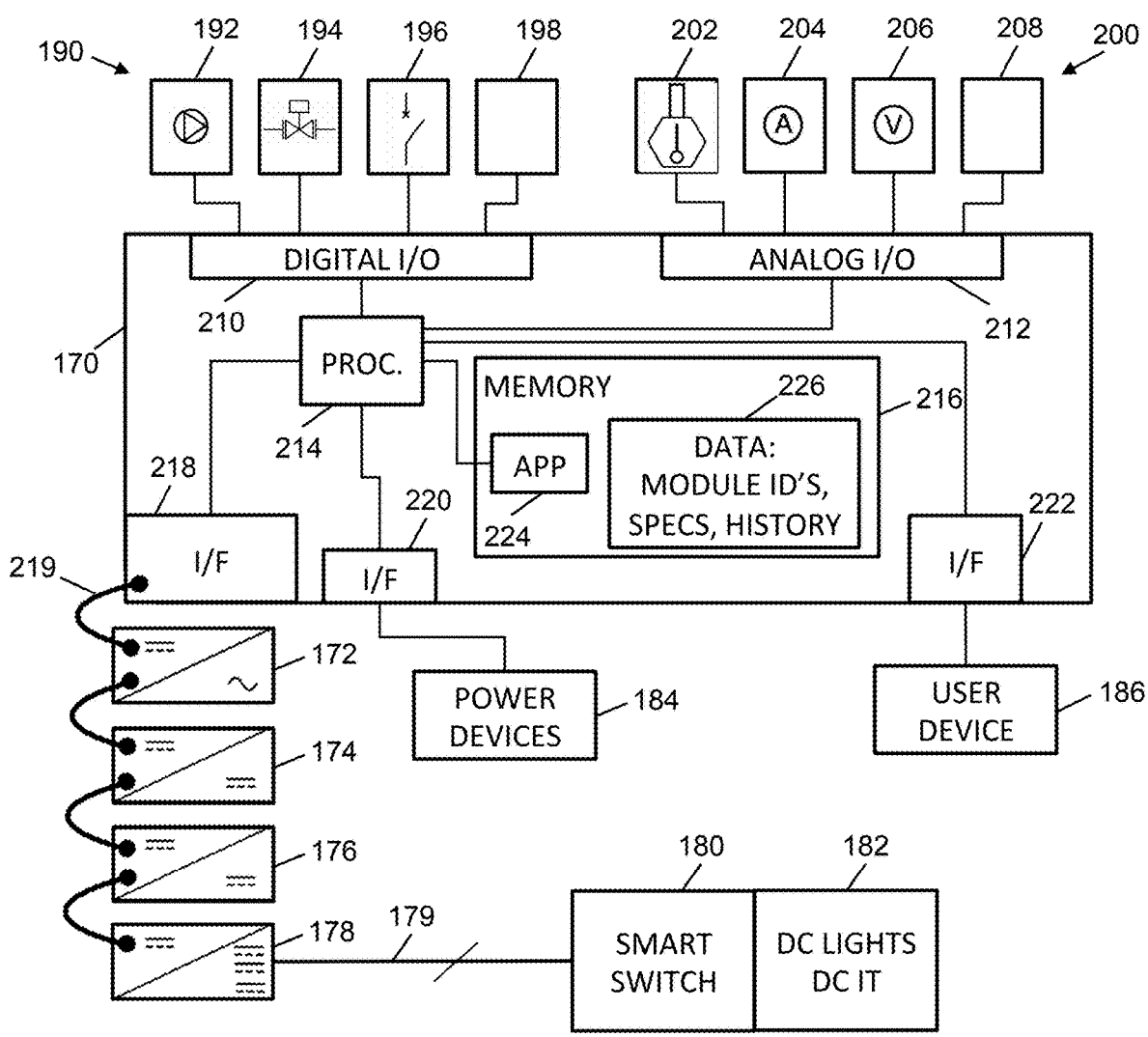
FIG. 13 is a block diagram of an electrical panel, according to an embodiment of the present invention.

Referring to FIG. 13, components of an exemplary system are shown. The system includes a system controller 170, which is hard-wired to the electrical panel or is located in one of the modules that impermanently connect to the electrical panel. If located in a module, it may be in its own module or in one of the power interface modules. The system controller includes processing circuitry in the form of one or more processors 214, which are operably connected to computer readable memory 216 included in the system controller. The system includes computer readable instructions 224 (e.g. an application) stored in the memory and computer readable data 226, also stored in the memory. The memory may be divided into one or more constituent memories, of the same or different types. The system controller may optionally include a display screen, operably connected to the processor(s). The memory stores data, including, for example, IDs of the power interface modules, specifications of the power interface modules and a history of operation of each power interface module. Depending on the programming language and data structure design there could be many options for the storage of data. In essence, each module's information is contained in a register that has a number of fields, each containing a parameter of interest. For example, a DC/DC module data structure has the voltages and currents for both its input and output ports, its average heatsink temperature, current operating mode, alarms, etc.

At least some of the computer readable instructions and computer readable data provide some of the functionality of the system when executed or read by the processor(s). Computer readable instructions may be broken down into blocks of code or modules.

The system controller is connected via an interface 218 and communications bus 219 to the individual controllers in the power interface modules 172, 174, 176, 178. The communications bus may be a CAN (controller area network) bus, for example, or a PM (power management) bus. As a power interface module is inserted into the panel, the connections to the communications bus may occur before, concurrently with or after the connections to the power rails, provided that when the module is fully inserted, both the power rails and the communications bus are connected to the module.

The system controller is also connected to the power rails. The system controller is connected via an interface 220 to one or more of the power devices 184 that are connected to the electrical panel. The system controller receives inputs from and/or sends outputs to various devices 190 connected to a digital input/output port 210. Such devices include, for example, a pump 192, and electro-valve 194, a controlled breaker or relay 196, or any other actuators or devices 198 that can be digitally controlled or that provide a digital output. The system controller also receives inputs from and/or sends outputs to various devices 200 connected to an analog input/output port 212. Such devices include, for example, a temperature sensor 202, a current sensor 204, a voltage sensor 206 or any other devices 208 that can be controlled by or that provide an analog signal.

The system controller may also be connected via an interface 222 to a user device 186, such as a smartphone, laptop or other computing device. The interface may be, for example a Wi-Fi™ interface, an Ethernet interface, CANbus or other suitable interface.

Optionally, one or more of the power interface modules 178 may have a direct PLC (power line communication) connection 179 to a smart switch 180 for controlling LED lighting 182, for example, or IT devices. This PLC connection is direct from the power interface module 178, and not via the power rails.

The voltage and current sensors for the power rails may be mounted in the power rail PCB and connected via analog signal conditioning to the system controller, irrespective of its location. In addition to measurements in the rails, each power module may also sense voltage and current at its input and output. In many cases there is only one power module connected to a power rail at a given time and, in those cases, the current they measure is identical to the power rail current measurement.

The modules both broadcast information and respond when polled. The CANOpen protocol may be used, for example. Whenever a new module is connected it will broadcast a message into the bus to let the system controller (master) know that it has been connected. Communication occurs all the time, as the system controller is constantly monitoring the operation of the power interface modules. The typical baud rate may be hundreds of kilobits per second, for example. The communication lines may be actually located in the busbar power strip, which is a PCB board that can support multiple signals. Power line communication is also possible, provided the high-noise nature of switch-mode power supplies can be overcome.

5. External Control

In one implementation, the system controller receives a command from, and transmits electrical load and monitoring data to, a user device via the communications module. The user device may be a smartphone, for example, another personal communications device, a laptop or other computer.

For example, the system controller detects a set of power interface modules that can jointly perform electric vehicle battery charging functions (e.g., DC/DC converter module and power inverter module) and executes a handshake to identify and configure the modules. In response to a successful handshake, the system controller transmits a confirmation message to the user device indicating that the system is able to charge an electric vehicle battery pack and presents information about the electric vehicle battery charging capabilities module on the user device. An electric vehicle is connected to the busbar power strip and is detected by the system controller. In response, the system controller generates and transmits a prompt, via the communications module, to the user device requesting a selection of either a fast-charging profile, or an energy efficient charging profile. In response to receipt of the selection of a fast-charging regime by the user via the user device, the system controller: activates an electrical circuit between the electrical service, the DC/DC charger module, the power inverter module, and the electric vehicle via the busbar power strip, to deliver conditioned power to the electric vehicle battery pack; and coordinates the operation of the DC/DC converter module and the power inverter module to perform the fast-charging profile. The system controller streams real-time data regarding the electrical load and performance of the electric vehicle battery charging process to the user device. In response to the electric vehicle battery pack reaching a threshold charge level, the system controller generates and transmits a notification to the user device indicating the electric vehicle is charged and ready for use.

In another example, the system controller detects a set of power interface modules that can jointly inject power into the electrical service (e.g., DC/DC converter module and power inverter module) and executes a handshake to identify and configure the modules. In response to a successful handshake, the system controller transmits a confirmation message to the user device indicating that the system is able to export power to the electrical service. Therefore, during a time of high power cost rates, the user device can transmit a command to the master controller to: activate an electrical circuit between the backup battery, the DC/DC charger module, the power inverter module, and the electrical service via the busbar power strip; and coordinate the operation of the DC/DC converter module and the power inverter module to inject power into the electrical service.

Therefore, the master controller, via the communications module, can detect modules arranged within the module interface region, command them to connect in a particular configuration, coordinate their joint operation, transmit data to a user device including prompts for input from a user, and receive data from a user device including commands.

6. Cooling System

Figure 14:
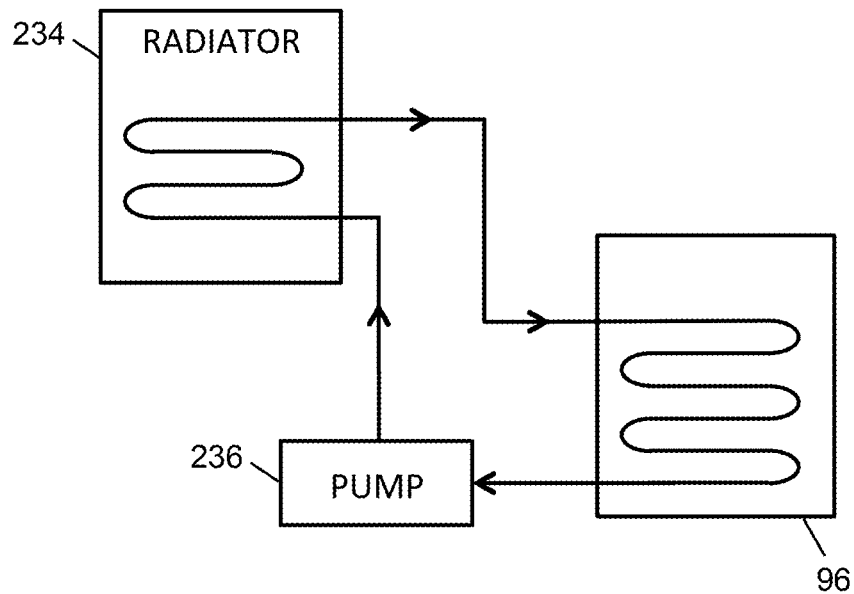
FIG. 14 is a schematic diagram for closed-loop liquid cooling of an electrical panel, according to an embodiment of the present invention.

In one implementation, as shown in FIG. 14, the cooling system is a closed-loop system defining a liquid heat exchanger 96 in the panel thermally coupled to the module interface region and connected to an inlet and an outlet. The outlet is connected to a pump 236, the pump is connected to a radiator 234, and the radiator is connected to the inlet, forming a closed loop. Generally, the closed-loop system is filled with water, but can be filled with any other suitable coolant medium. The pump is configured to pump water from the liquid heat exchanger through the radiator, and to the inlet of the liquid heat exchanger. The closed-loop system is configured to extract thermal energy from the module interface region and dissipate thermal energy via the radiator. In one variation, the pump is electrically connected to a temperature sensor (i.e., a thermocouple) thermally connected to the module interface region and is configured to pump water in response to the temperature of the module interface region exceeding a threshold temperature, as detected by the temperature sensor. In another variation, the closed-loop system is filled with a refrigerant and further includes a compressor pump and expansion valve. In this variation, the radiator is replaced with a condenser.

For example, a power interface module (e.g., DC/DC converter module) is arranged within the module interface region and is connected to an electric vehicle. As the power interface module conditions power, the temperature of the module interface region increases beyond a first threshold temperature. The temperature sensor detects the increase in temperature and in response, sends a control signal to the pump to begin pumping water through the closed-loop system. Thermal energy is transferred from the liquid heat exchanger to the chiller and dissipated. When the temperature of the module interface region falls below a second threshold temperature, as detected by the temperature sensor, the pump disengages and water ceases to flow in the closed-loop system. Therefore, the closed-loop system can selectively engage to cool the module interface region based on the real-time temperature detected within the module interface region.

Figure 15:
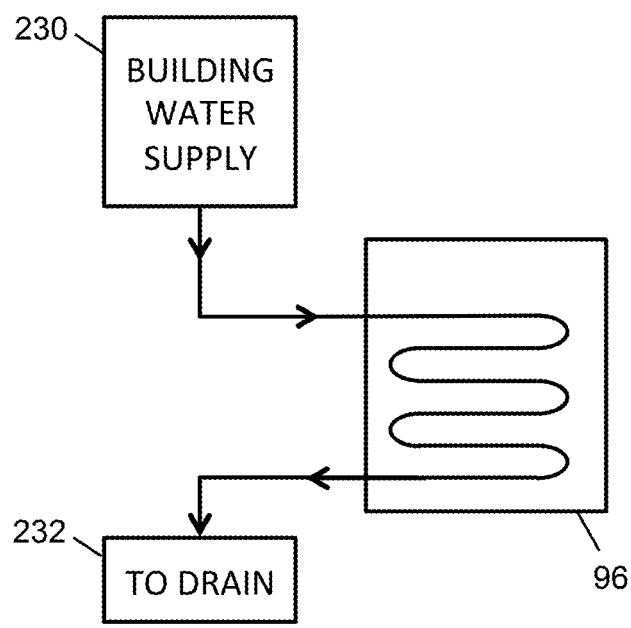
FIG. 15 is a schematic diagram for open-loop liquid cooling of an electrical panel, according to an embodiment of the present invention.

In another implementation as shown in FIG. 15, the cooling system is an open-loop system wherein the inlet of the liquid heat exchanger 96 is connected to and receives water from the building water supply 230; and the outlet of the liquid heat exchanger is connected to and sends water to a drain 232.

For example, during operation, water is supplied by the building water supply under nominal pressure and is received by and circulated through the liquid heat exchanger. The now heated water exits the liquid heat exchanger and is expelled through the outlet and into the drain.

In one variation, the open-loop system includes an electromechanical valve arranged between the building water supply and the liquid heat exchanger, and electrically connected to a temperature sensor thermally coupled to the module interface region. In response to the temperature of the module interface region exceeding a first threshold temperature as detected by the temperature sensor, the valve opens, releasing water from the building water supply into the liquid heat exchanger. In response to the temperature of the module interface region falling below a second threshold temperature, as detected by the temperature sensor, the valve closes.

For example, during operation, the valve is initially closed, and as power passes through a set of power interface modules in the module interface region, the module interface region increases in temperature as heat is dissipated from the set of power interface modules. The temperature sensor detects the increase in temperature in the module interface region beyond a first threshold temperature and transmits a signal to the valve. In response, the valve opens, and water flows from the building water supply into the liquid heat exchanger. The water increases in temperature as it circulates through the liquid heat exchanger. The water then exits the liquid heat exchanger and passes into the drain external to the module interface region, removing heat energy from the module interface region. The temperature sensor detects a decrease in the temperature of the module interface region beyond a second threshold temperature and transmits a signal to the valve. In response, the valve closes, preventing excess water being released through the liquid heat exchanger and ultimately into the drain, reducing water waste.

Therefore, in one variation of the open-loop system, the module interface region can be passively cooled using a liquid coolant (i.e., water) at a constant flow, supplied by the building water supply. In another variation of the open-loop system, the module interface can be intermittently cooled by selectively dispensing water to the liquid heat exchanger based on the detected temperature of the module interface region, reducing the volume of water required to cool the module interface region.

Figure 16:
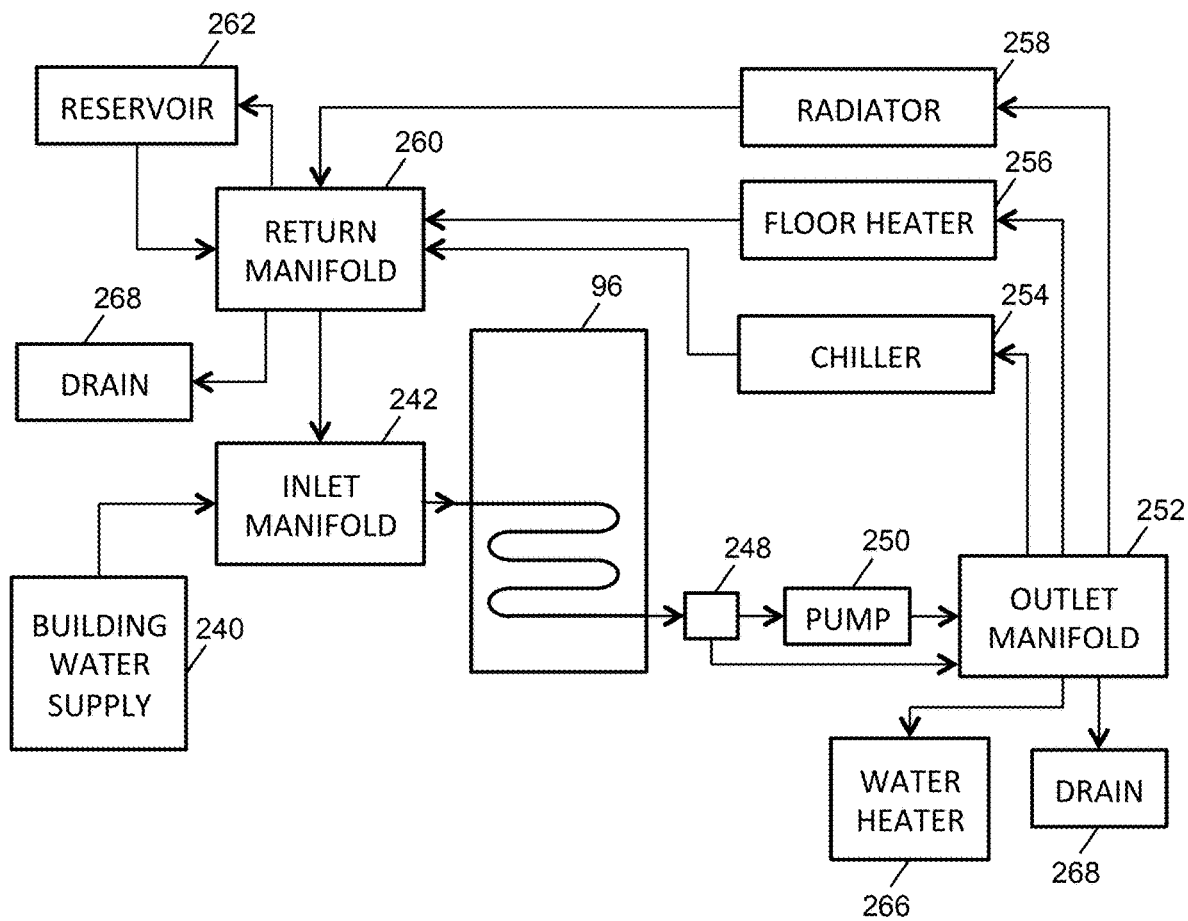
FIG. 16 is a schematic diagram for variable liquid cooling of an electrical panel, according to an embodiment of the present invention.

In yet another implementation shown in FIG. 16, the cooling system is a variable system defining: a liquid heat exchanger 96; a set of heated fluid transfer components configured to receive heated water, dissipate heat, and release cooled water; an inlet manifold 242 defining a set of valves and connected to both the building water supply 240 and the liquid heat exchanger; a return manifold 260 defining a set of valves connected to the liquid heat exchanger and to the outlet side of each heated fluid transfer component in the set of heated fluid transfer components; and an outlet manifold 252 defining a set of valves connected to the inlet side of each heated fluid transfer component; and a drain 268. The variable system is configured to: selectively open or close the set of valves of the inlet manifold to receive water from the building water supply and/or the return manifold; to selectively release water into the liquid heat exchanger; and to selectively open or close the set of valves of the outlet manifold to release heated water into a heated fluid transfer component and/or the drain 268.

In one variation, the variable system further defines a pump 250, the inlet of the pump connected to the outlet of the liquid heat exchanger 96 via a bypass valve 248, and the outlet of the pump connected to the outlet manifold 252. The outlet manifold is further connected to a drain 268, and a set of heated fluid transfer components comprising: a water heater 266, a radiator 258, a floor heater 256, and a chiller 254. The outlet manifold is configured to selectively open or close the set of valves to receive water from the pump, and to selectively release water into the water heater, the radiator, the floor heater, and/or the chiller. The water heater receives heated water from the outlet manifold, reducing the amount of energy required to maintain a volume of hot water in the water heater tank. The radiator is connected to the return manifold and is configured to receive heated water from the outlet manifold, dissipate heat from the water into the space adjacent to the radiator, and release cooler water into the return manifold 260. Generally, the radiator is placed in an interior space, such as a garage, to heat the interior space. The floor heater defines a liquid under-floor heating system connected to the return manifold and is configured to receive heated water from the outlet manifold, dissipate heat from the water into a floor surface, and release cooler water into the return manifold. The chiller is connected to the return manifold and is configured to receive heated water from the outlet manifold, dissipate heat from the water into the surrounding environment, and release cooler water to the return manifold. Generally, the chiller is placed in an exterior space, to release heat energy externally from the building. The variable system further includes a temperature sensor thermally coupled to the module interface region and connected to the pump, inlet manifold, and outlet manifold.

In one variation, the return manifold is further connected to a reservoir 262 configured to receive and store a volume of water. The reservoir can receive excess water from the return manifold, and release water into the return manifold. The variable system further includes a bypass valve 248 connected to the liquid heat exchanger outlet and the pump and is configured to selectively route water from the liquid heat exchanger through the pump, or directly to the outlet manifold, bypassing the pump. The variable system further includes pressure and temperature sensors coupled to each of the fluid transfer components, and to the controller. The controller then selectively routes heated water to a fluid transfer component based on detected demand for use of the fluid transfer component. Further, the pressure and temperature sensors coupled to each of the fluid transfer components are configured to transmit monitoring data to the controller. The controller can transmit monitoring data to and receive control signals from a user device. The variable system can selectively open and close the set of valves in response to user input received via the controller from the user device.

For example, in response to the temperature of the module interface region exceeding a first threshold temperature, as detected by the temperature sensor, the variable system can operate in a constant flow mode in which the inlet manifold opens the set of valves to receive water from the building water supply and send water to the liquid heat exchanger. The water emerges from the liquid heat exchanger as heated water and passes through the bypass valve and to the outlet manifold. The heated water is then expelled from the system via the drain.

In another example, in response to the temperature of the module interface region exceeding a first threshold temperature as detected by the temperature sensor, the variable system can operate in a modified closed-loop mode in which the inlet manifold opens the set of valves to receive water from the building water supply and send water to the liquid heat exchanger. The water emerges from the liquid heat exchanger as heated water and passes through the bypass valve and to the outlet manifold. The heated water is then selectively routed to the radiator, disposed in a garage, which dissipates the heat into the adjacent space in the garage. The heated water emerges from the radiator as cooled water, the cooled water travels to the return manifold, and the cooled water is transferred to the inlet manifold and mixed with water from the building water supply. The mixed water is transferred to the liquid heat exchanger.

In one variation of this example, the cooled water is transferred to the reservoir. In response to the volume of water in the reservoir exceeding a threshold amount, and while the temperature of the module interface region remains above the first threshold temperature the inlet manifold closes the valve to the building water supply, the bypass valve closes the connection to the outlet manifold, the return manifold opens the valve to receive water from the reservoir, forming a closed-loop. The closed-loop includes the inlet manifold, liquid heat exchanger, pump, outlet manifold, radiator, and return manifold, and is connected to the reservoir, which collects and stores a volume of cooled water. The pump engages to pump water through the closed-loop to cool the system and dissipate the heat via the radiator.

In a further variation of this example, the inlet manifold, bypass valve, and outlet manifold can selectively open and close valves such that the loop can receive water from the building water supply, expel water to a drain, or maintain a closed-loop configuration in response to user input or detected demand (i.e., a user turns on a hot water faucet resulting in demand for hot water from the hot water heater). In particular, in response to demand for hot water from the hot water heater, the outlet manifold opens and closes the set of valves to send heated water to the hot water heater tank.

In yet another variation of this example, the variable cooling system transmits temperature and pressure data to a user device via the controller and communication module. In response to a command signal to transfer heated water to the radiator received by the controller from the user device, the outlet manifold opens and closes the set of valves to send heated water to the radiator.

In yet another implementation, the cooling system is configured to: connect the inlet and outlet of the cooling system to an air duct or pipe for natural convection cooling using air; or connect to a duct or pipe for forced air cooling with a fan. For example, during operation, the fan is initially off, and as power is converted through a set of power interface modules in the module interface region, the module interface region increases in temperature as heat is dissipated from the set of power interface modules. The temperature sensor detects the increase in temperature in the module interface region beyond a first threshold temperature and transmits a signal to turn on the fan. In response, the fan creates air flow through the heat exchanger, thus removing heat energy from the module interface region. The temperature sensor detects a decrease in the temperature of the module interface region beyond a second threshold temperature and transmits a signal to turn off the fan. An alternative mode of operation of the cooling system includes a variable speed fan that adjusts the fan air flow based on the temperature of the heat exchanger as a closed-loop temperature control system.

Therefore, the variable cooling system can operate as: an open-loop cooling system; a closed-loop cooling system; a semi-closed-loop cooling system; and as a variable system configured to selectively route heated water to various heated fluid/gas transfer components in response to user input and/or detected demand for the heated fluid/gas transfer component.

7. Method to Reconfigure the Energy Distribution System

Figure 17:
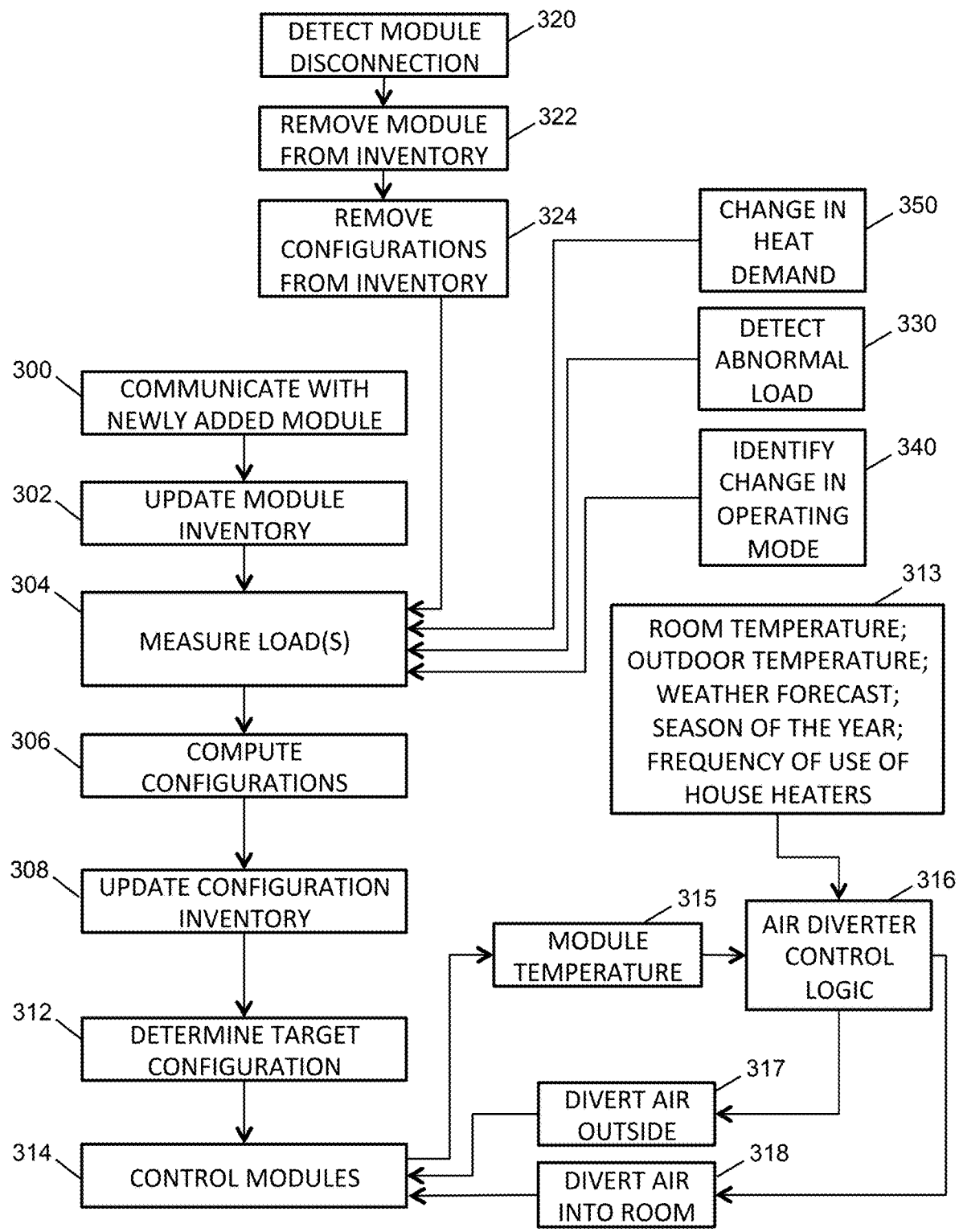
FIG. 17 is a flowchart of a method undertaken by the system controller of the energy distribution system, according to an embodiment of the present invention.

The system controller identifies the existence of DC sources (solar array and/or battery) and AC sources (genset, grid) and extracts the information of their sizes (rated capacities) when connected to the electrical panel (the energy distribution system/the system). This is achieved by communication between the sources and the system controller, or by user-specific settings. The system controller also communicates with the connected power interface modules to identify their types (DC/DC converter, inverter or rectifier) and sizes (power, current and voltage ratings). The information is stored in a module inventory list. After an internal change (power modules connected or disconnected) or external change (peripheral power sources or loads present or removed) in the system operating environment, the system controller responds and reconfigures the connections of power modules. The power interface modules have internal circuitry connected via one or more switches to one or more of the power rails. In reference to FIG. 17, the system controller controls the switches following the methods below to reconfigure the connections of the power modules to the power rails. Based on the configurations, a set of thermal control algorithms determines where the heat needs to be diverted.

7.1 Scenario 1

If a power module is connected to the system, the system controller:
1. Communicates with the module to identify the type and size of the newly added module, in step 300.
2. Updates the power modules inventory list, in step 302.
3. Measures the power in and out of the peripheral power sources and loads, in step 304.
4. Computes all the possible system configurations that can supply the loads and can be created by using the additional module plus the pre-existing modules, in step 306. Each configuration is defined as a set of interconnections, a set of system specifications, and a set of performance indicators that correlate to the possible use of the system. For example, by adding a new DC/DC converter to a system already possessing a DC/DC converter, there are at least two new potential systems to be created:

Configuration 1: a system in which each DC/DC converter is used for a separate application:
DC/DC converter number 1 input is connected to a solar array and output is connected to the internal system DC bus.
DC/DC converter number 2 input is connected to a battery and output is connected to the internal system DC bus.

Configuration 2: a system in which both DC/DC converters are connected in parallel to a battery to potentially double the discharge capacity of the battery in order to supply heavier loads.

Each system configuration has a set of technical specifications including operating ranges and safety limits, such as the power rating and the input and output voltage and current ranges. In addition, each configuration can perform differently depending on the operating point. For example, when using configuration 2, the system will have a particular value for overall efficiency when operating at rated power which will determine the amount of heat that can be diverted into or outside the building.

5. Updates its inventory of system configurations, in step 308.
6. Calculates the overall system efficiency and degradation for all possible system configuration and decides on a target configuration, in step 312.
7. Commands the power modules to reconfigure their connection to the power rails in order to attain the target configuration, in step 314.

7.2 Scenario 2

If a power module is detected to be disconnected from the system, in step 320, the system controller:
1. Removes such power modules from the inventory of power modules, in step 322.
2. Removes all system configurations that involve such a module from the inventory of system configurations, in step 324.
3. Proceeds with steps 3 to 7 from Scenario 1 (i.e. to step 304).

7.3 Scenario 3

During a change in the power demand of the load exceeding a predefined threshold (by having increased or reduced), the system controller, upon detecting the abnormal load in step 330:

1. Proceeds with steps 3 to 7 from Scenario 1 (i.e. to step 304).

7.4 Scenario 4

During a change in the system operational mode, such as going from a solar grid-connected inverter system (injecting energy into the grid, from the solar array) to a battery charging system, the system controller:
1. Identifies the required change in the operating mode and based on the inventory of system configurations, in step 340.
2. Proceeds with steps 3 to 7 from Scenario 1 (i.e. to step 304).

7.5 Scenario 5

During a change in the building heat demand exceeding a predefined threshold (e.g. the need for hot water in the washrooms for the user/s to take a shower), the system controller, upon detecting the change in the demand in step 350:
1. Proceeds with steps 3 to 7 from Scenario 1 (i.e. to step 304).

Note that for this scenario, in step 312, the master controller will select a system configuration that enables higher power transfer (e.g. starting the charge of the already connected electric vehicles) in order to produce more heat. This scenario covers the case for when a user needs hot water, for say taking a shower. The system will decide to charge the electric vehicles (assuming that the user/s have already connected one or more electric vehicles to the house docking station, this could be at night, after people get home). Charging the EV's requires the system to operate at a higher power. As the waste heat is proportional to the operating power (electrical efficiency is more or less constant), by charging the vehicles, we will produce more waste heat that can be re-purposed to heat up the water.

While the system controller is controlling the power interface modules, the fan and air diverter in the panel may be controlled in response to a signal received from the system controller based on one or more of the following information: power module temperatures, in step 315, outdoor temperature, indoor temperature, weather forecast (via Wi-Fi™), season of the year (winter/summer), frequency of use of electric heaters or forced air heater, all in step 313. For example, the diverter control logic in step 316 may determine that during winter, the hot air from the heat exchanger is to be directed inside the building, in step 318. In another example, the diverter control logic in step 316 may determine that during the summer, the hot air from the heat exchanger is to be directed outside of the building, in step 317. In another simple implementation, if the temperature in the room is too high, in step 316, then the hot air from the heat exchanger is directed outside of the building, in step 317. If the temperature is too low, in step 316, then the hot air is directed into the room, in step 318. Power modules temperature, outdoor temperature, indoor temperature and other information can be used to reconfigure the fan and air diverter.

A person skilled in the art may understand that this method can also be applied to control the liquid cooling system described in paragraphs above.

8. Variations

The systems and methods described herein can be embodied and/or implemented at least in part as a machine configured to receive a computer-readable medium storing computer-readable instructions in the form of an application. The instructions can be executed by one or more processors and/or with computing components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by one or more processors, and/or with computer-executable components integrated with system or apparatuses and networks of the type described above. The computer-readable instructions can be stored on any suitable computer readable media such as RAM (random access memory), ROM (read-only memory), flash memory, EEPROM (electrically erasable programmable read-only memory), optical devices (CD or DVD), hard drives, floppy drives, or any suitable device. The computing component can be a processor but any suitable dedicated hardware device can (alternatively or additionally) execute the instructions.

The detailed description has been presented partly in terms of methods or processes, symbolic representations of operations, functionalities and features of the invention. A software implemented method or process is here, and generally, understood to be a self-consistent sequence of steps leading to a desired result. It will be further appreciated that the line between firmware and software is not always sharp, it being understood by those skilled in the art that the software implemented processes described herein may be embodied in hardware, firmware, software, or any combination thereof. Such processes may be controlled by coded instructions such as microcode and/or by stored programming instructions in one or more tangible or non-transient media readable by a computer or processor.

It will be clear to one having skill in the art that further variations to the specific details disclosed herein can be made, resulting in other embodiments that are within the scope of the invention disclosed. Two or more steps in the flowchart may be performed in a different order, other steps may be added, or one or more may be removed without altering the main function of the invention.

In general, unless otherwise indicated, singular elements may be in the plural and vice versa with no loss of generality. Specific quantities, proportions, configurations, materials that have been given are examples only, and others are possible in other embodiments.

As a person skilled in the art will recognize from the previous detailed description and from the figures and claims, modifications and changes can be made to the embodiments of the invention without departing from the scope of this invention as defined in the claims.

The invention claimed is:

1. An electrical panel that converts electrical power and is cooled, the electrical panel comprising:
 a casing defining an inlet for a coolant and an outlet for the coolant;
 a heat-exchanging zone within the casing between the inlet and the outlet;
 multiple power rails located in the casing outside of the heat-exchanging zone;
 multiple sets of first connectors electrically connected to the power rails, each set located to connect to second connectors on a power interface module, which, when connected to the electrical panel is in direct thermal contact with the heat-exchanging zone;

a communications bus that electrically connects to the power interface module when the second connectors are connected to at least some of the first connectors; and a system controller programmed to detect an electrical connection of the power interface module to the communications bus;

wherein, when the power interface module is connected to the electrical panel, the coolant flows from the inlet, through the heat-exchanging zone and to the outlet and draws heat from the power interface module while remaining external to the power interface module.

2. The electrical panel of claim 1, further comprising, for each set of first connectors, one or more fixing devices for constraining the power interface module in the electrical panel, wherein the casing further defines one or more apertures or slots for mounting the casing to one or more wall studs.

3. The electrical panel of claim 1, wherein some of the power rails are located at one side of the heat-exchanging zone and the remainder of the power rails are located at an opposing side of the heat-exchanging zone.

4. The electrical panel of claim 1, further comprising a fan that causes said coolant flow, wherein the coolant is air.

5. The electrical panel of claim 4, further comprising an air diverter connected downstream of the fan, the air diverter being adjustable between:
a first setting in which the air is directed through the outlet, wherein the outlet is in a side wall of the casing; and
a second setting in which the air is directed through another outlet, wherein the other outlet is in the side wall of the casing, another side wall of the casing or in a front cover of the electrical panel.

6. The electrical panel of claim 1, further comprising a heat exchanger and a fixing device, the heat exchanger defining a fluid channel that is connected between the inlet and the outlet, wherein:
the coolant is a liquid; and
a back of the power interface module is held in contact with the heat exchanger with the fixing device when the power interface module is connected to the electrical panel.

7. The electrical panel of claim 1, wherein the system controller comprises processing circuitry and computer readable memory storing computer readable instructions, which, when executed by the processing circuitry, cause the system controller to determine:
whether the power interface module comprises interconnection circuitry that is controlled by the system controller to make and break a direct electrical connection between at least two of the power rails;
whether the power interface module comprises a DC-DC converter;
whether the power interface module comprises an inverter; and
whether the power interface module comprises a rectifier.

8. The electrical panel of claim 7, wherein the computer readable instructions, when executed by the processing circuitry, further cause the system controller to determine all permutations of power transfer and interconnectivity available between the power rails when the power interface module and one or more other power interface modules are connected to the electrical panel, as a result of each of the power interface modules having internal circuitry connected via one or more switches to one or more of the power rails.

9. The electrical panel of claim 7, wherein the computer readable instructions, when executed by the processing circuitry, further cause the system controller to command the power interface module and all other power interface modules, when connected to the electrical panel, to connect internal circuitry to or disconnect the internal circuitry from one or more of the power rails.

10. The electrical panel of claim 1, wherein each first connector is a socket and each second connector is a plug.

11. An energy distribution system comprising:
multiple power interface modules; and
an electrical panel to which the multiple power interface modules are impermanently connected, the electrical panel comprising:
a casing defining an inlet for a coolant and an outlet for the coolant;
a heat-exchanging zone within the casing between the inlet and the outlet;
multiple power rails located in the casing outside of the heat-exchanging zone;
multiple sets of first connectors electrically connected to the power rails, each set located to connect to second connectors on a different one of the power interface modules, which, when connected to the electrical panel are in direct thermal contact with the heat-exchanging zone;
a communications bus that electrically connects to the power interface modules when the second connectors are connected to at least some of the first connectors; and
a system controller programmed to detect an electrical connection of each of the power interface modules to the communications bus;
wherein, when the power interface modules are connected to the electrical panel, the coolant flows from the inlet, through the heat-exchanging zone and to the outlet and draws heat from the power interface modules while remaining external to the power interface modules.

12. The energy distribution system of claim 11, wherein:
the electrical panel further comprises a fan that causes said coolant flow;
the coolant is air; and
a back of each power interface module has a heat sink with fins projecting into the heat-exchanging zone.

13. The energy distribution system of claim 12, wherein the electrical panel comprises an air diverter connected downstream of the fan, the air diverter being adjustable between:
a first setting in which the air is directed through the outlet, wherein the outlet is in a side wall of the casing; and
a second setting in which the air is directed through another outlet, wherein the other outlet is in the side wall of the casing, another side wall of the casing or in a front cover of the electrical panel.

14. The energy distribution system of claim 11, wherein one of the power interface modules is an interconnection module that is controlled by the system controller to make and break a direct electrical connection between at least two of the power rails.

15. The energy distribution system of claim 11, further comprising:
a heat exchanger in the heat-exchanging zone, the heat exchanger defining a fluid channel that is connected between the inlet and the outlet, wherein the coolant is a liquid; and multiple fixing devices that hold backs of the power interface modules in contact with the heat exchanger.

16. The energy distribution system of claim 11, wherein each power interface module is an interconnection module, a DC-DC converter, an inverter, a rectifier or any combination selected therefrom.

17. The energy distribution system of claim 11, wherein each power interface module:

has one or more recesses on an enclosure thereof, each recess extending to a front surface of the power interface module; and can be safely connected to and removed from the electrical panel when the electrical panel is live.

18. The energy distribution system of claim 11, wherein the system controller is located in either:

the casing and is hard-wired to the power rails and the communications bus; or a module that connects to one of the sets of first connectors.

19. The energy distribution system of claim 11, wherein the system controller comprises processing circuitry and computer readable memory storing computer readable instructions, which, when executed by the processing circuitry, cause the system controller to:

determine a type of each power interface module;

determine all permutations of power transfer and interconnectivity available between the power rails, as a result of each of the power interface modules having internal circuitry connected via one or more switches to one or more of the power rails;

command at least one of the power interface modules to connect its internal circuitry to or disconnect its internal circuitry from one or more of the power rails;

command said at least one or another of the power interface modules to switch its internal circuitry from being connected to at least one of the power rails to being connected to at least a different one of the power rails; and coordinate operation of the power interface modules.

20. The energy distribution system of claim 11, wherein at least one of the power interface modules comprises at least one switch connected between:

at least two of its second connectors to make and break a connection between the power rails to which said at least two of the second connectors are connected via corresponding ones of the first connectors; or at least one of its second connectors and an external connector to make and break a connection between the power rail to which at least said one of the second connectors is connected and the external connector.

* * * * *